United States Patent [19]

Hase et al.

[11] Patent Number: 5,404,250
[45] Date of Patent: Apr. 4, 1995

[54] MAGNETIC DISK STORAGE APPARATUS WITH PHASE SYNC CIRCUIT HAVING CONTROLLABLE RESPONSE CHARACTERISTIC

[75] Inventors: Kenichi Hase; Syoichi Miyazawa; Ryutaro Horita, all of Yokohama; Shinichi Kojima, Takasaki; Akihiko Hirano, Fujisawa; Akira Uragami, Takasaki, all of Japan

[73] Assignee: Hitachi, Ltd., Tokyo, Japan

[21] Appl. No.: 177,694

[22] Filed: Jan. 4, 1994

Related U.S. Application Data

[63] Continuation of Ser. No. 603,294, Oct. 25, 1990, abandoned.

[30] Foreign Application Priority Data

Oct. 30, 1989 [JP] Japan .................. 1-282748
Oct. 30, 1989 [JP] Japan .................. 1-282749
Apr. 19, 1990 [JP] Japan .................. 2-103313

[51] Int. Cl.6 .................. G11B 5/09; H03K 5/00; H03L 7/00
[52] U.S. Cl. .................. 360/51; 331/25; 327/157
[58] Field of Search .................. 360/51, 65, 61, 46; 329/325; 375/120; 331/17, 25, 34, 185; 307/262, 269

[56] References Cited

U.S. PATENT DOCUMENTS

| | | | |
|---|---|---|---|
| 4,422,109 | 12/1983 | Sampei et al. | 360/65 |
| 4,494,080 | 1/1985 | Call | 331/8 |
| 4,849,714 | 7/1989 | Takahashi et al. | 331/1 A |
| 4,862,296 | 8/1989 | Murabayashi et al. | 360/51 |
| 4,894,734 | 1/1990 | Fischler et al. | 360/51 |
| 4,980,653 | 12/1990 | Shepherd | 331/25 |
| 5,187,615 | 2/1993 | Miyazawa et al. | 360/46 |

*Primary Examiner*—Donald Hajec
*Assistant Examiner*—Won Tae C. Kim
*Attorney, Agent, or Firm*—Antonelli, Terry, Stout & Kraus

[57] ABSTRACT

A magnetic disk storage apparatus provides with a phase locked loop or a phase sync circuit including a phase comparator, a charge pump, a filter and a voltage-controlled oscillator. The phase sync circuit includes a register which is connected to an information processing system and adapted to store therein the response characteristics of the phase comparator, the charge pump, the filter and the voltage-controlled oscillator as instructed from the information processing system. In this way, in accordance with the information on the response characteristics from the information processing system, the phase sync circuit is controlled thereby to assure a stable operation even in the case of the data transfer speed varying between inner and outer track such as occurs in a magnetic disk.

2 Claims, 22 Drawing Sheets

F I G. 33
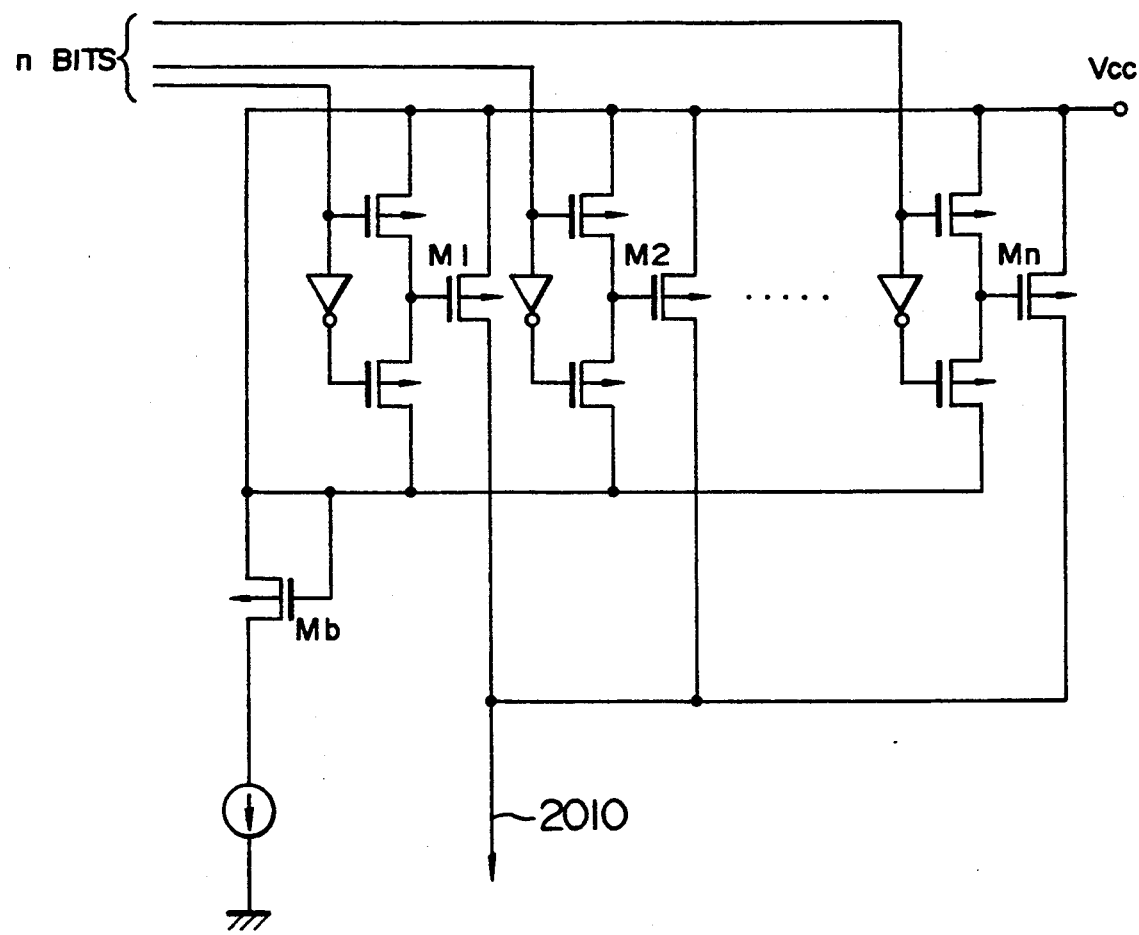

F I G. 36
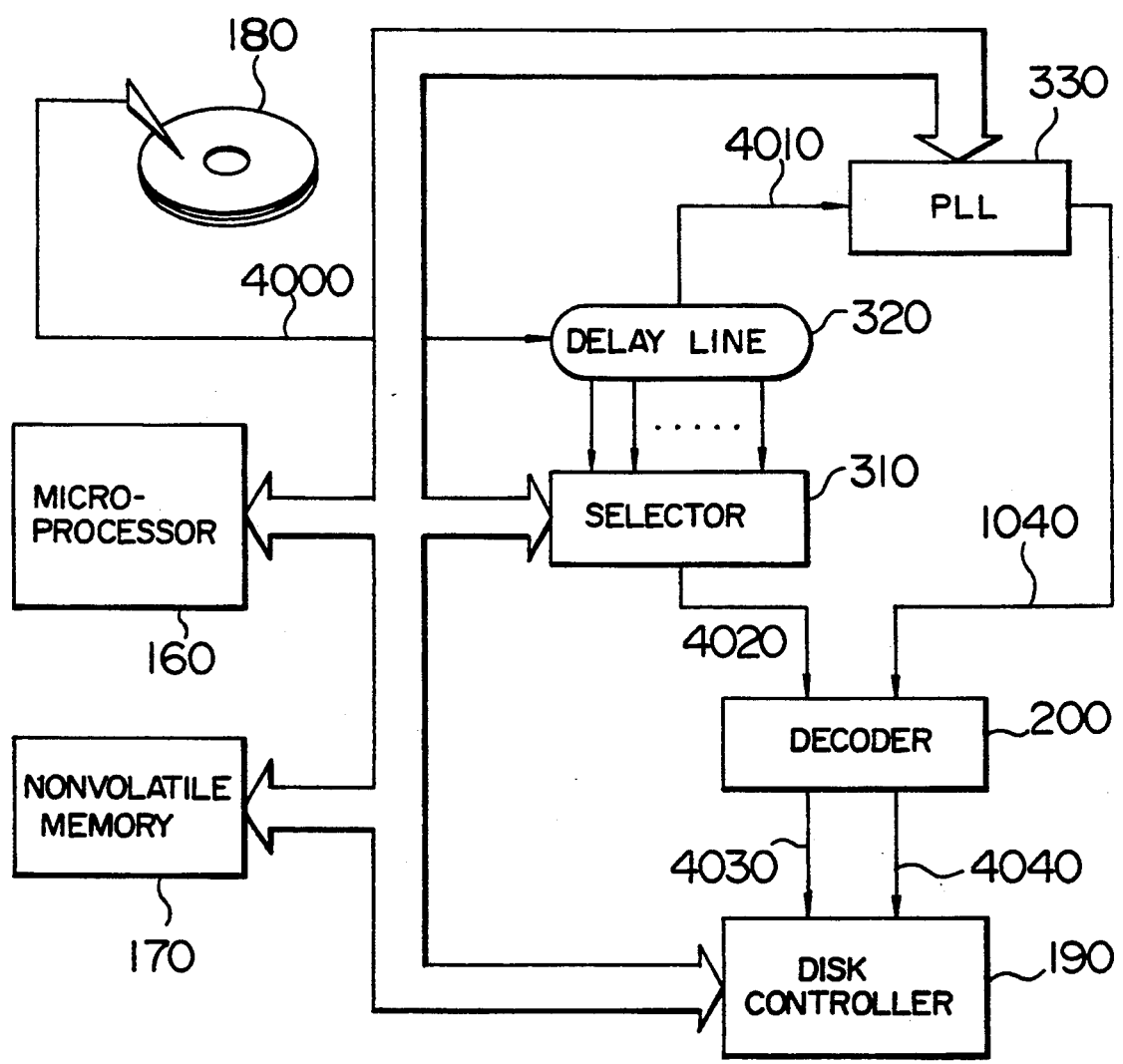

MAGNETIC DISK STORAGE APPARATUS WITH PHASE SYNC CIRCUIT HAVING CONTROLLABLE RESPONSE CHARACTERISTIC

This application is a continuation of application Ser. No. 603,294, filed on Oct. 25, 1990, now abandoned.

BACKGROUND OF THE INVENTION

The present invention relates to a phase sync circuit, or more in particular to a magnetic disk apparatus in which the write data transfer speed is changed in accordance with the inner and outer track of a magnetic disk.

In conventional apparatuses, a phase sync circuit for generating a sync clock is normally configured of a PLL (Phase-Locked Loop). Constants indicating the responsiveness of the PLL or phase sync circuit include a characteristic frequency $W_n$ and an attenuation rate $\xi$. These constants are dependent on such conditions as the initial phase difference and the phase pull-in time.

The phase pull-in time changes with the data transfer speed if the pattern length is fixed, since the phase pull-in is requied to be effected within a phase sync pattern. If a PLL is configured with the gain of the frequency-phase comparator plus charge pump as $K_d$ and the gain of a VCO (voltage-controlled oscillator) as $K_o$, the characteristic frequency $W_n$ and the attenuation rate $\xi$ are expressed as $$W_n = \sqrt{K_d \cdot K_o / C_1}$$

$$\xi = (C_1 + C_2) \cdot R \cdot W_n / 2$$

where $C_1$, $C_2$ and $R$ designate capacitors and a resistor respectively making up a filter.

In a conventional phase sync circuit for the information processing system, the data transfer speed is determined uniquely for each system. Once the data transfer speed of a system is determined, therefore, it is possible to calculate the most suitable constant for a PLL and set the same constant as a fixed value.

A magnetic disk unit for the information processing system, on the other hand, generally has a fixed write data speed. In such a case, however, the limitation of the linear recording density of the magnetic disk is determined by the innermost track, the density of which is progressively decreased toward the outer track.

A conventional phase sync circuit is well known as disclosed in JP-A-63-217719.

A configuration of this phase sync circuit is shown in FIG. 22.

The phase sync circuit comprises a phase comparator 121 for comparing an input pulse signal with the phase of the output signal of a voltage controlled oscillator, a smoothing filter 112 for smoothing the output of the phase comparator, a loop filter 113 connected to the smoothing filter, and a voltage controlled oscillator 114 controlled by the voltage generated in the loop filter.

A specific circuit configuration of the phase comparator 121 is shown in FIG. 23.

An operation timing chart for the phase comparator 121 is shown in FIGS. 24 and 25.

FIG. 24 is an operation timing chart for the output signal 200 of the voltage controlled oscillator 114, the duty factor of which is smaller than 50%, and FIG. 25 is another timing chart for the output signal 200, the duty factor of which is larger than 50%.

The $T_C$ signal becomes "H" state at the leading edge of an input pulse signal 100, and becomes "L" state at the trailing edge of the next-arriving output signal 200. At the same time, the $T_S$ signal becomes "H" state at the same edge and is reduced to "L" state at the leading edge of the output signal 200. At the same time, the $T_D$ signal becomes "H" state at the same edge, and is reduced to "L" state at the trailing edge of the output signal 200.

The difference between the pulse width of the $T_C$ signal and that of the $T_D$ signal makes up the phase difference between the input pulse signal 100 and the output signal 200.

The smoothing filter 112 converts the phase difference into a voltage, holds the voltage at timing Ts, and applies a current proportional to the voltage to the loop filter 113. FIG. 26 shows the output characteristic of the smoothing filter 112.

The loop filter 113 includes a resistor $R_F$ and a capacitor $C_F$. A loop filter having a different configuration may be used with equal effect. The current produced from the smoothing filter 112 is converted into a voltage at the loop filter 113, and controls the voltage-controlled oscillator 114 thereby to change the frequency of the output signal 200 thereof. The operation of the phase sync circuit makes it possible for the phase of the output signal to coincide with that of the input pulse signal 100.

SUMMARY OF THE INVENTION

In recent years, a technique has been proposed to write data with a predetermined constant linear recording density in a magnetic disk in order to improve the recording capacity of the magnetic disk across the innermost to outermost track.

Specifically, such a technique carried out by changing the write clock between inner and outer peripheries and varying the transfer speed at the same time, thereby to obtain a constant linear density.

Data is read out of such a magnetic disk at a constant rotational speed of the disk with different read data speeds. As a result, it is necessary to generate a variable clock synchronous with the read data speed.

The above-described PLL according to the prior art, it is fails to take into consideration the case in which a single system may have a plurality of data speeds, and is therefore incapable of switching the PLL characteristic in accordance with the data speed. There is a problem that a stable operation is impossible to secure for all data speeds.

On the other hand a phase comparator circuit according to the prior art is capable of producing a DC current proportional to the phase difference, thus producing a stable output signal under synchronous conditions. However, there is a problem that the characteristics of the smoothing filter, like those of the smoothing filter (FIG. 26) described above, very with the duty factor of the output signal 200 of the voltage-controlled oscillator 114. The problems will be explained below with reference to FIG. 27.

The characteristics of the smoothing filter 112 are expressed by the two equations shown below.

$$G_l = \frac{T_D \cdot gm}{C_1} \quad (1)$$

$$I_0 = \frac{I_C}{T_D}(T_C - T_D) = \frac{I_C}{T_D}\Delta\Phi \qquad (2)$$

where G1 is a sampling servo gain affecting the transient characteristic of the smoothing filter, $T_D$ the pulse width of the output signal 200, gm the mutual conductance due to a transistor M1 and a resistor $R_T$, and C1 a capacitor for an integration circuit. Character Ic designates a drain current of a transistor M2 which provides an output current of the smoothing filter. $\Delta\Phi$ designates a phase difference between the input pulse signal 100 and the output signal 200.

The sampling servo gain G1 is preferably the unity, and an oscillation occurs if this gain is 2 or more.

If the pulse width $T_D$ of the output signal fluctuates, so does the sampling servo gain G1 in proportion thereto.

Also, as shown in FIG. 26, the output current $I_0$ has the linear range and inclination thereof changed. A change in linear range reduces the capture range of the phase sync circuit, while a change in inclination results in the variation in the loop gain of the phase sync circuit.

The present invention has been developed in order to solve the aforementioned problems, and an object thereof is to provide a magnetic disk apparatus capable of stable operation against all data speeds by switching the characteristics of a phase sync circuit to the optimum conditions in accordance with the data speed.

Another object of the present invention is to provide a magnetic disk apparatus capable of stable operation without depending on the time width of the output signal of the phase sync signal.

In order to achieve the above-mentioned objects, according to a first aspect of the present invention, a phase sync circuit is configured of a plurality of circuits including storage means for storing instructions for changing the response characteristics of each circuit and means for changing the response characteristics in compliance with the instructions stored in the storage means.

According to another aspect of the present invention, there is provided a phase sync circuit comprising phase comparator means, charge pump means, filter means, voltage controlled oscillation means, storage means for storing instructions to change the response characteristics, means for changing at least selected one of the amount of gain of the charge pump, the filter constant of the filter means and the central frequency of the voltage controlled oscillator.

According to still another aspect of the present invention, there is provided a clock generation circuit with a phase sync circuit comprising means for ordering a change in the response characteristics in accordance with a change in the period of an asynchronous signal, and means for changing the response characteristics in accordance with the instructions stored in the storage means.

According to a further aspect of the present invention, there is provided a magnetic disk storage apparatus comprising means for generating a reference clock for handling a read data in accordance with the access position on a disk-type storage medium at the time of read access, means for storing the instructions, and means for changing the response characteristics on the basis of the instructions stored in the storage means.

According to a still further aspect of the present invention, the magnetic disk apparatus preferably comprises means for instructing the response characteristics of a phase sync circuit generated in a reference clock handling a read data to be changed in accordance with the access position on the magnetic disk at the time of read access to the magnetic disk, in such a manner not to cause any false operation attributable to the interference between codes due to the peak shift of the stored data position, means for storing the instructions, and means for changing the response characteristics in accordance with the instructions stored in the storage means.

According to still another aspect of the present invention, there is provided an information processing system comprising the magnetic disk apparatus and an information processing unit connected to each other.

According to a further aspect of the present invention, there is provided a one-chip LSI comprising a phase sync circuit and means for setting the responsiveness of the phase sync circuit.

Each of the phase sync circuits and the clock generation circuits are preferably configured in the LSI.

In a phase sync circuit according to the first aspect of the present invention, the response characteristics are changed in accordance with the instructions stored in the means for storing instructions to change the response characteristics.

Also according to another phase sync circuit according to the present invention, at least selected one or more of the amount of gain of the charge pump, the filter constant of the filter means and the central frequency of the voltage controlled oscillator means is changed in accordance with the instructions stored in the storage means.

Further, according to a clock generation circuit of the present invention, an instruction for changing the response characteristics is set in the storage means in accordance with a change in the period of the sync signal, the response characteristics of the phase sync circuit being changed on the basis of the instructions stored in the storage means.

Furthermore, according to a magnetic disk apparatus of the present invention, storage means has stored therein such instructions as to prevent a false operation attributable to an inter-code interference due to a shift of the waveform peak associated with the stored data of the response characteristics in a phase sync circuit for generating a reference clock handling a read data in accordance with the access position on the magnetic disk at the time of read access of the magnetic disk. Also, the phase sync circuit has the response characteristics thereof changed in accordance with the instructions stored in the storage means.

As described above, according to the present invention, the optimum response characteristic is capable of being set in accordance with any data speed for a single system having a plurality of transfer speeds, thus realizing a phase sync circuit capable of producing an always stable clock signal.

Especially, the magnetic disk apparatus according to the present invention meets the requirements of switching the PLL characteristics with high accuracy in accordance with the data speed in such a manner as to prevent a synchronization, error the phenomenon of what is called the mis-lock in which a false synchronization occurs at a different frequency, or the over-following in which the clock signal excessively follows the data signal, due to the inter-code interference casued by the shift of a waveform peak of the data recorded in the magnetic disk.

According to a second feature of the present invention, in order to achieve the above-mentioned objects, there is provided a phase sync circuit comprising a voltage-controlled oscillator, a phase comparator for producing a first pulse signal and a second pulse signal having a time width which is the sum of the time width of the first pulse signal and a time length associated with the phase difference between a synchronized signal and an output signal of the voltage-controlled oscillator, a smoothing filter including an integration circuit supplied with an output of the phase comparator for performing the charging operation during the period of the second pulse signal and the discharging operation during the period of the first pulse signal thereby to determine the control voltage value of the voltage-controlled oscillator on the basis of the output voltage of the integration circuit, and means for setting the time width of the first pulse signal to one-half of a period of the output signal of the voltage-controlled oscillator.

According to a specific aspect of the second feature, there is provided a phase sync circuit comprising a voltage controlled oscillator for producing an output signal of a frequency dependent on the control voltage, a phase comparator for producing a first pulse signal and a second pulse signal having a time width which is the sum of the time width of the first pulse signal and a time length associated with the phase difference between a synchronized signal and the output signal of the phase sync circuit, sample-hold means including an integration circuit supplied with an output of the phase comparator for performing the charging operation during the period of the second pulse signal and the discharging operation during the period of the first pulse signal, the sample-hold means sample-holding the output voltage of the integration circuit, a smoothing filter including means for producing a current in accordance with the voltage held by the sample-hold means, a loop filter for producing a control voltage of the voltage-controlled oscillator from the output current of the smoothing filter, and means for setting the time width of the first pulse width to one-half of a period of the ouput signal of the voltage-controlled oscillator.

According to another specific aspect of the second feature of the present invention, there is provided a phase sync circuit comprising a voltage-controlled oscillator for producing a signal of a phase opposite to the regular phase of the frequency associated with the control voltage, a phase comparator for producing a first pulse signal having a time width one-half of a period of the output signal of the voltage-controlled oscillator and a second pulse signal having a time width which is the sum of the time width of the first pulse signal and a time length associated with the phase difference between a synchronized signal and the regular-phase signal or the opposite-phase signal, from the edges along the same direction of the synchronized signal and the regular-phase and opposite-phase signals, and a smoothing filter including an integration circuit supplied with an output of the phase comparator for performing the charging operation during the period of the second pulse signal and the discharging operation during the period of the first pulse signal thereby to determine the control voltage value of the voltage-controlled oscillator on the basis of the output voltage of the integration circuit.

According to another aspect of the second feature of the present invention, there is provided a phase sync circuit comprising a voltage-controlled oscillator for producing an output signal of a frequency in accordance with the control voltage, means for regulating the duty factor of the output signal of the voltage-controlled oscillator to 50%, a phase comparator for producing a first pulse signal having a time width one-half of a period of the output signal of the voltage-controlled oscillator and a second pulse signal having a time width which is the sum of the time width of the first pulse signal and a time length associated with the phase difference between a synchronized signal and the output signal of the voltage-controlled oscillator, from a regulated output signal of the voltage-controlled oscillator, and a smoothing filter including an integration circuit supplied with an output of the phase comparator for performing the charging operation during the period of the second pulse signal and the discharging operation during the period of the first pulse signal thereby to determine the control voltage value of the voltage-controlled oscillator on the basis of the output voltage of the integration circuit.

According to a further aspect of the second feature of the present invention, there is provided a phase sync circuit comprising a voltage-controlled oscillator for producing an output signal of a frequency in accordance with the control voltage, a phase comparator for producing a first pulse signal and a second pulse signal having a time width which is the sum of the time width of the first pulse signal and a time length associated with the phase difference between a synchronized signal and an output of the voltage-controlled oscillator, and a smoothing filter including an integration circuit supplied with an output signal of the phase comparator for performing the operation of charging a variable capacitor during the period of the second pulse signal and discharging the same capacitor during the period of the first pulse signal thereby to determine the control voltage value of the voltage-controlled oscillator on the basis of the output voltage of the integration circuit.

According to the phase sync circuit having the second feature of the invention, the smoothing filter is supplied with a first pulse signal having a time width one-half of a period of the output signal of the voltage-controlled oscillator from the phase comparator and a second pulse signal having a time width which is the sum of the time width of the first pulse signal and a time length associated with the phase difference between a synchronized signal and an output signal of the phase sync circuit, and performs the charging operation during the period of the second pulse period and the discharging operation during the period of the first pulse period at an integration circuit thereby to determine the control voltage value of the voltage-controlled oscillator on the basis of the output voltage of the integration circuit.

According to a phase sync circuit having an aspect of the second feature of the present invention, the smoothing filter is supplied with a first pulse signal having a time width one-half of a period of the output signal of the voltage-controlled oscillator from the phase comparator and a second pulse signal having a time width which is the sum of the time width of the first pulse signal and a time length associated with the phase difference between a synchronized signal and the output signal of the phase sync circuit, and performs the charging operation during the period of the second pulse signal and the discharging operation during the period of the first pulse signal at the integration circuit, the phase sync circuit including sampling means for sample-holding the output voltage of the integration circuit and producing a current in accordance with the voltage held by the sample-hold means.

According to the phase sync circuit having still another aspect of the second feature of the present invention, the voltage-controlled oscillator produces signals of regular and opposite phases having a frequency in accordance with the control voltage, and the phase comparator produces a first pulse signal having a time width one-half of a period of the output signal of the voltage-controlled oscillator and a second pulse signal having a time width which is the sum of the time width of the first pulse signal and a time length associated with the phase difference between a synchronized signal and the regular-phase signal or the opposite-phase signal, from the edges along the same direction of the synchronized signal and the regular-phase and opposite-phase signals.

According to the phase sync circuit having a further aspect of the second feature of the present invention, the output signal of the voltage-controlled oscillator has the duty factor thereof regulated to 50%, and the phase comparator subsequently produces, from the regulated output signal of the voltage-controlled oscillator, a first pulse signal having a time width one-half of a period of the output signal of the voltage-controlled oscillator and a second pulse signal having a time width which is the sum of the time width of the first pulse signal and a time length associated with the phase difference between a synchronized signal and the output signal of the voltage-controlled oscillator.

According to the phase sync circuit having a still further aspect of the second feature of the present invention, the variable capacitor included in the integration circuit of the smoothing filter has the capacitance thereof appropriately regulated to attain the desired transient characteristic of the smoothing filter.

According to a third feature of the present invention, there is provided a magnetic disk storage apparatus comprising a phase sync circuit for generating a read clock in synchronism with the read data at the time of read access of a disk-type storage medium, a decoding circuit for decoding the read data by use of the read clock, delay means for delaying the read data and providing a phase difference between the read data to be synchronized by the phase sync circuit and the read data to be decoded by the decoding circuit, and control means for controlling the read operation, wherein the control means is adapted to change the amount of delay in the delay means in accordance with the read access position in the disk-type storage medium.

According to one specific aspect of the third feature of the present invention, there is provided a magnetic disk storage apparatus comprising an oscillator for generating a reference clock at the time of write access of the disk-type storage medium, a phase sync circuit for generating a write clock in synchronism with the reference clock in accordance with the write access position in the disk-type storage medium, a coding circuit for coding the write data by use of the write clock, write means for storing the coded write data in the disk-type storage medium, out-of-phase detection means for detecting an out-of-phase condition of the phase sync circuit, and means for inhibiting the writing of the write data into the disk-type storage medium upon detection of an out-of-phase condition by the out-of-phase detection means.

According to the magnetic disk storage apparatus having the third feature of the present invention, an instruction to change the response characteristic of the phase sync circuit for generating a reference clock handling the read data is stored in storage means in accordance with the access position in the disk-type storage medium at the time of read access thereof, so that the phase sync circuit changes the response characteristic in accordance with the instruction stored in the storage means.

According to the magnetic disk apparatus having a specific aspect of the third feature of the present invention, storage means has stored therein such a change instruction as to prevent a false operation attributable to an inter-code interference due to the waveform peak shift at the storage position of the response characteristic data in the phase sync circuit for generating a reference clock handling the read data in accordance with the access position on the magnetic disk at the time of read access thereof, the phase sync circuit changing the response characteristic in accordance with the instruction stored in the storage means.

As described above, according to the third feature of the present invention, an optimum response characteristic is set in accordance with all data speeds for a single system having a plurality of transfer speeds, thereby realizing a phase sync circuit always capable of supplying a stable clock.

In a magnetic disk apparatus, in particular, the present invention meets the requirements of switching the PLL characteristic with high accuracy in accordance with the data speed in such a manner as to prevent a false operation, mis-lock or excessive following which otherwise might be caused by an inter-code interference due to a peak waveform shift of the recording data in the magnetic disk.

According to the magnetic disk storage apparatus having still another aspect of the third feature of the present invention, there are provided means for delaying the read data in accordance with the read access position at the time of read access of the disk-type storage medium, and means for providing a predetermined phase difference between the read data to be synchronized by the phase sync circuit and the one to be decoded by the decoding circuit thereby to realize a stable decoding operation regardless of the read data transfer speed.

According to the magnetic disk storage apparatus having a further aspect of the third feature of the present invention, in order to cope with an out-of-phase condition of the phase sync circuit which may be caused by the change in write data transfer speed, the writing of write data into the disk-type storage medium is inhibited to prevent the data stored in the storage medium from being destroyed in case of an out-of-phase condition of the phase sync circuit.

BRIEF DESCRIPTION OF THE DRAWINGS

FIG. 33 is a circuit diagram showing a configuration of a digital-analog converter.

FIG. 36 is a block diagram showing a configuration on read side of a magnetic disk storage apparatus.

DESCRIPTION OF THE PREFERRED EMBODIMENTS

An embodiment of a PLL having the first feature of the present invention will be explained below with reference to an application to a magnetic disk apparatus.

Figure 1:
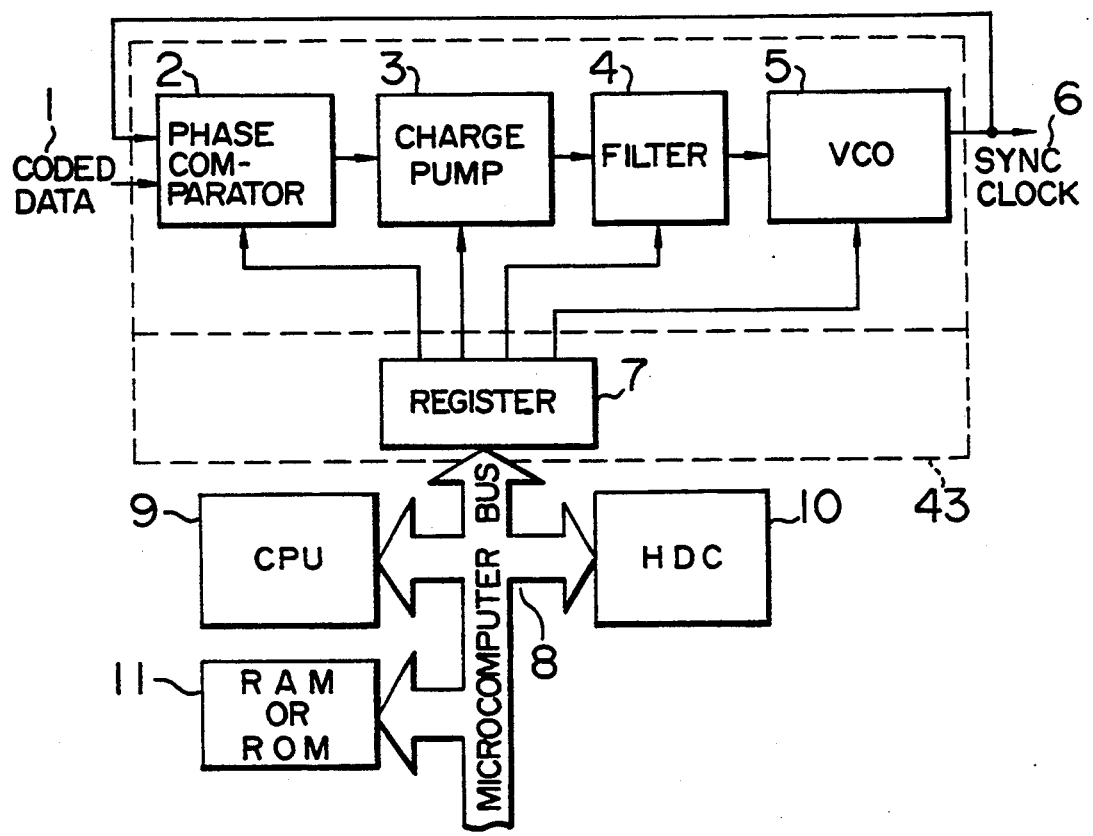
FIG. 1 is a block diagram showing a configuration of a phase sync circuit and peripheral parts thereof according to an embodiment of the present invention.

FIG. 1 is a block diagram showing a peripheral configuration of a PLL (phase-locked loop or phase sync circuit) of a magnetic disk apparatus according to the present embodiment.

This system is configured of a PLL (Phase-Locked Loop) 43 including a frequency phase comparator 2 for comparing the frequency and phase of the coded data read out from a magnetic disk, a charge pump 3, a filter 4 for converting the current output into a voltage, and a VCO (Voltage-Controlled Oscillator) 5 for generating a sync clock 6 of a frequency commensurate with the voltage of the filter 4, a register 7 for storing the switching information such as a gain and a constant for each block, a microcomputer bus 8 for writing data into the register 7, a CPU for performing the arithmetic operation for the whole system, an HDC (Hard Disk Controller) 10 for controlling the whole system, and a ROM or RAM 11 for storing a program of the CPU and such data as an optimum constant.

Figure 2:
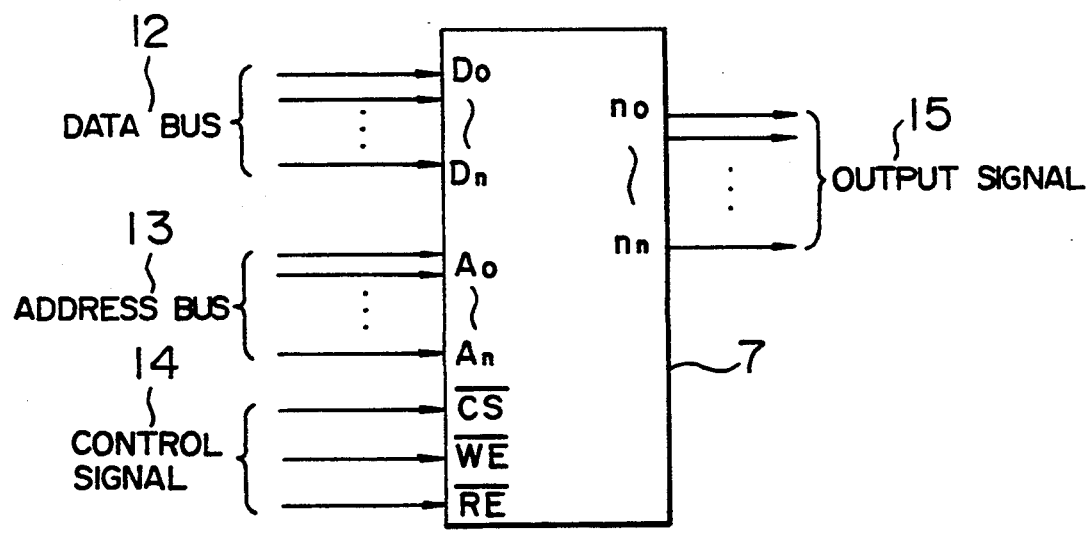
FIG. 2 is a diagram showing a configuration of a register circuit as storage means.

FIG. 2 shows internal signals of the register 7, in which the microcomputer bus 8 is composed of bidirectional data buses $D_0$ to $D_n$ 12, address buses $A_0$ to $A_n$ 13, and a control signal 14, with the output signals $n_0$ to $n_n$ 15 connected to each block.

The magnetic disk apparatus according to this embodiment is such a system that in order to improve the recording capacity of the disk, each or all cylinders are divided into several zones and the write speed is varied from one zone to another thereby to reduce a change in linear density.

In this case, the period of the read data also varies from one cylinder or zone to another, and therefore it is necessary to optimize the PLL characteristic of the phase sync circuit in accordance with the transfer speed indicating the data period respectively.

The operation-of reading the data written in a given track will be explained specifically. In response to a read instruction of a host computer or the like, the CPU 9 determines the cylinder or zone containing the track having a sector which stores the intended data, selects the information having the constant of PLL corresponding to the particular cylinder or zone out of the ROM or RAM 11, and writes into the registers 7 through the microcomputer bus 8.

The registers 7 sends the particular information to each block of the PLL, and each block in turn switches the gain, mode, etc., on the basis of the information, thereby waking up a PLL having the characteristic most suitable for the transfer speed written with the intended data.

The ROM or RAM 11 has stored therein the information on a constant making up an optimum PLL for the transfer speed in each cylinder or zone theoretically or exprimentally. The information is written in the register 7 in such a manner that as when writing into an ordinary external RAM, data on the data bus 12 is written in a register designated through the address bus 13 by $\overline{CS}$ and $\overline{WE}$ signals in the control signal 14. The written information is thus applied to each PLL block as the output signal 15.

The register 7 is rewritten at the same time as or immediately before the head seek operation, so that the register 7 has been rewritten or the gain, constant, and the like of each block completely switched to a sufficiently stable condition within a time length (ten and several ms) before the complete positioning of the head. Any problem of the reading operation is not therefore posed.

An example of switching the gain of each PLL block will be explained below with reference to FIGS. 3 to 6.

Figure 3:
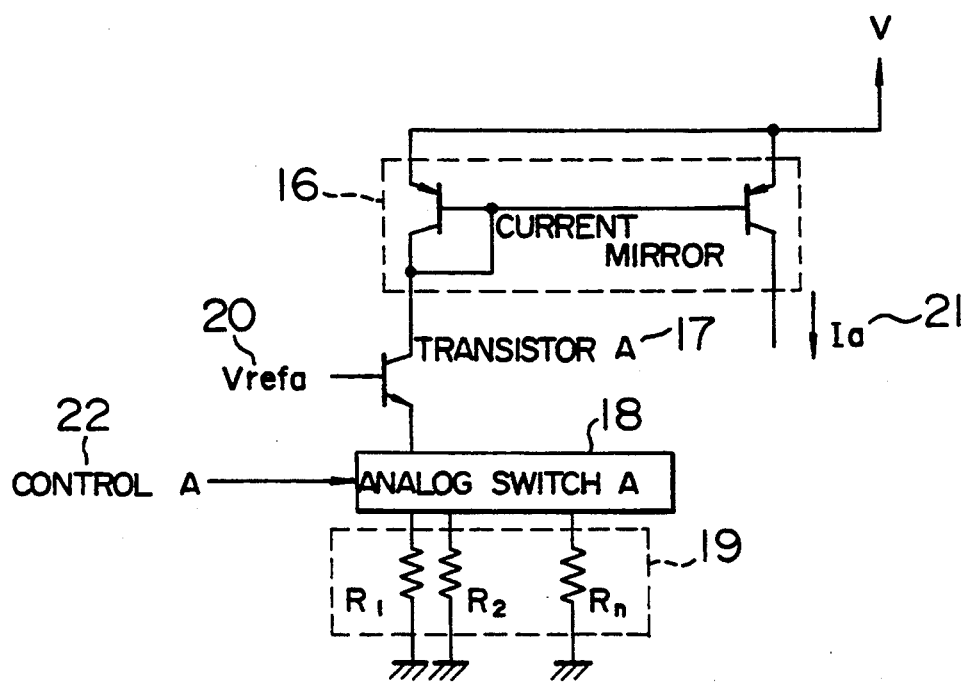
FIG. 3 is a circuit diagram showing a gain switching circuit as a means for changing the response characteristic of a charge pump.

FIG. 3 shows a gain switching circuit for switching the value of a constant current produced from the charge pump 4, in which the gain switching circuit includes a current mirror 16, a level shift transistor A 17, an analog switch A 18 and resistors $R_1$ to $R_n$ 19. The gain of the charge pump is expressed as $Ia/8\pi$, where a reference current supplied from the gain switching circuit is given as Ia 21.

A current determined by one of the resistors 19 selected by the analog switch A 18 is supplied from the reference voltage Vrefa 20 through the transistor A 17 and returned on the current mirror 16 to provide the reference current Ia 21. As a result, if there are prepared a number n of resistance values of the resistors 19 and the analog switch A is adapted to be switched by the control signal A 22 sent from the resistor 7, the reference currents Ia in the number of n are obtained to permit a number n of gain switchings.

Figure 4:
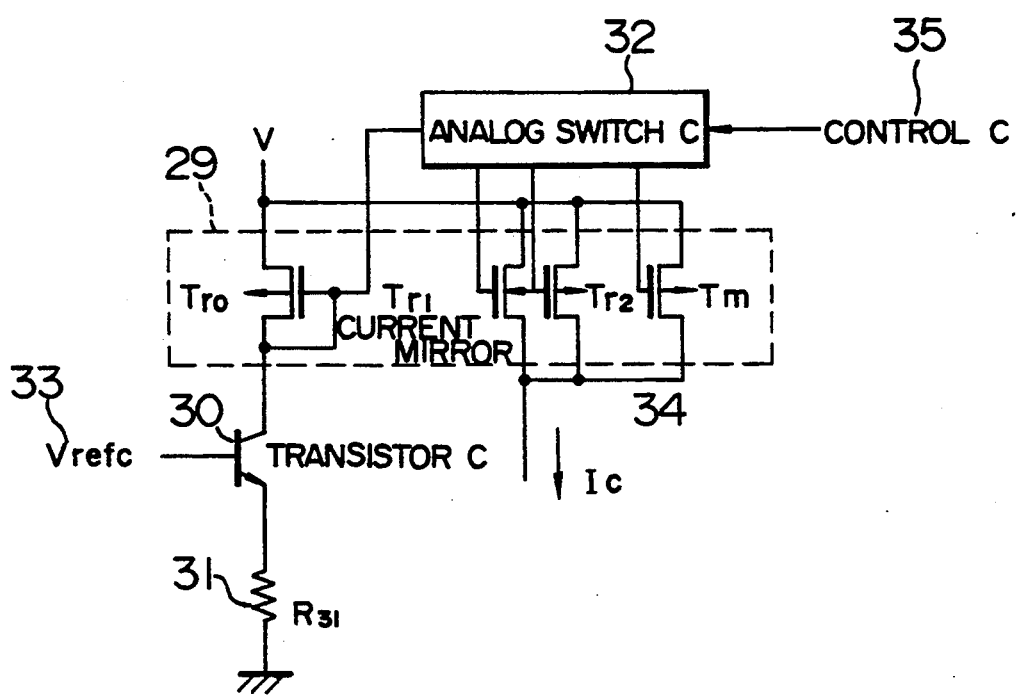
FIG. 4 is a circuit diagram showing another switching circuit of the charge pump.

FIG. 4 shows another example of the gain switching circuit for the charge pump 3. This gain switching circuit includes a current mirror 29 having transistors Tr1 to Trn, a transistor C 30, a resistor $R_{31}$ and an analog switch C 32. As in the case of FIG. 3, a current determined by the transistor C 30 and the resistor $R_{31}$ 31 from the reference voltage Vrefc 33 is returned on the current mirror 29 to generate a reference current Ic 34. A number n of transistors are connected in parallel on the receiving side of the current mirror 29, and the reference current Ic 34 is changed by changing the ratio of the return current as a result of changing the number of the transistors by means of the analog switch C 32 in accordance with the control signal C 35 from the register 7.

Although it is possible to switch the output current Ia of the gain switching circuit by switching the voltage Vrefa 20, this method has the disadvantage of a great effect of external disturbances and an unstable operation.

Figure 5:
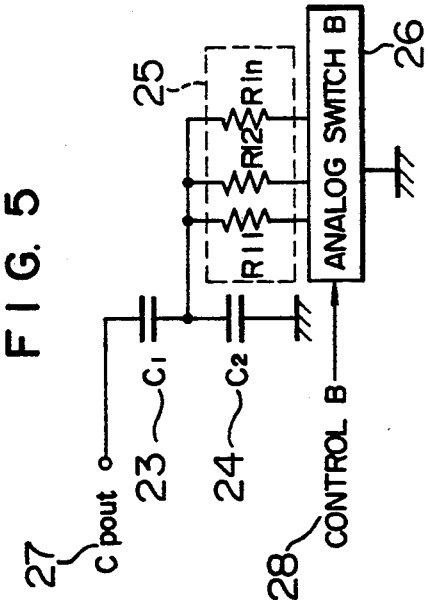
FIG. 5 is a circuit diagram showing a constant switching circuit as a means for changing the response characteristic of a filter.

FIG. 5 shows a switching circuit for the filter. This switching circuit includes capacitors $C_1$ 23, $C_2$ 24, resistors $R_{11}$ to $R_{ln}$ and an analog switch B 26. In the case of the filter having a configuration as shown in FIG. 4, the attenuation rate $\xi$ is expressed as $$\epsilon = (C_1 + C_2) \cdot R / 2$$

where $w_n$ is a characteristic frequency, and R one of the resistors $R_{11}$ to $R_{ln}$ 25. It is thus possible to set any of a number n of attenuation rates $\xi$ by preparing a number n of resistance values of the resistor 25 and switching the analog switch B 26 by the control signal B 28 sent from the resistor 7.

Figure 6:
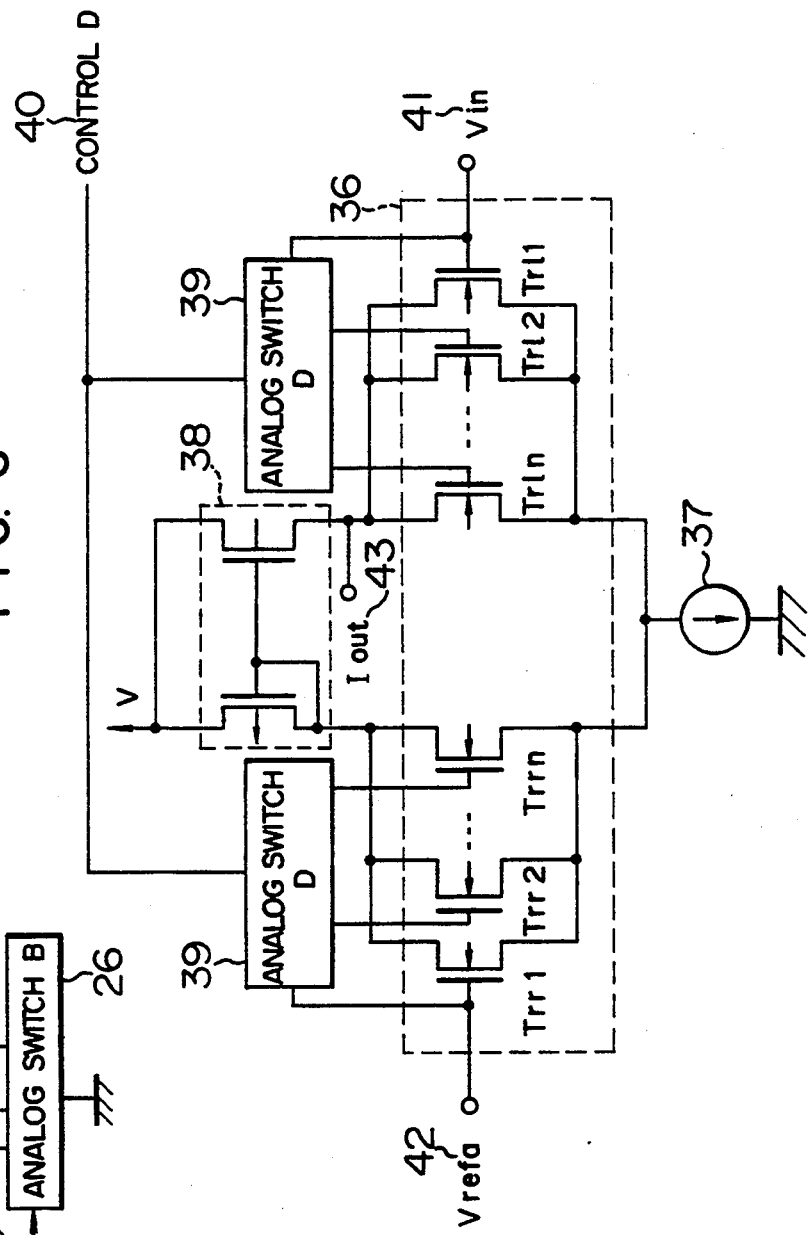
FIG. 6 is a circuit diagram showing a gain switching circuit as a means for changing the response characteristic of a voltage-controlled oscillator.

FIG. 6 shows a gain switching circuit for the VCO 5. This gain switching circuit includes a differential amplifier circuit having a number 2n of input transistors Trr1 to Trrn, Tr11 to tr1n 36, a reference current source 37 and a load transistor 38, and analog switches D 39.

The gain of the VCO 5, as shown in FIG. 6, is determined by the gain of the differential amplifier circuit in the input stage and is known to be proportional to the ½ square of the size of the input transistor 36. Thus two sets of transistors each in the number of n are connected to the input transistor 36, and the number of transistors thus connected is switched by the analog switch D 39 in response to the control signal D 40 from the resistor 7, thereby changing the size in the number of n equivalently thereby to switch the gain.

It is necessary to fix the VCO 5 to a central frequency dependent on the transfer speed immediately before the pull-in operation in order to shorten the pull-in time and enlarge the capture range. The central frequency $f_0$ of the VCO 5 is expressed by $$f_0 = \frac{I_O}{4C V_{BE}}$$

where C is the capacitance of a timing capacitor, $V_{BE}$ the base-emitter voltage of the transistor and $I_O$ a control current.

In the system variable in transfer speed, the central frequency is required to be set by changing the control current $I_O$ against each transfer speed. The control current $I_O$ may be set as desired to change the central frequency by using a circuit similar to the gain conversion circuit of the charge pump shown in FIG. 4 thereby to change the central frequency.

Now, explanation will be made about an example of the magnetic disk data control circuit 70 including a PLL according to the present invention.

Figure 7:
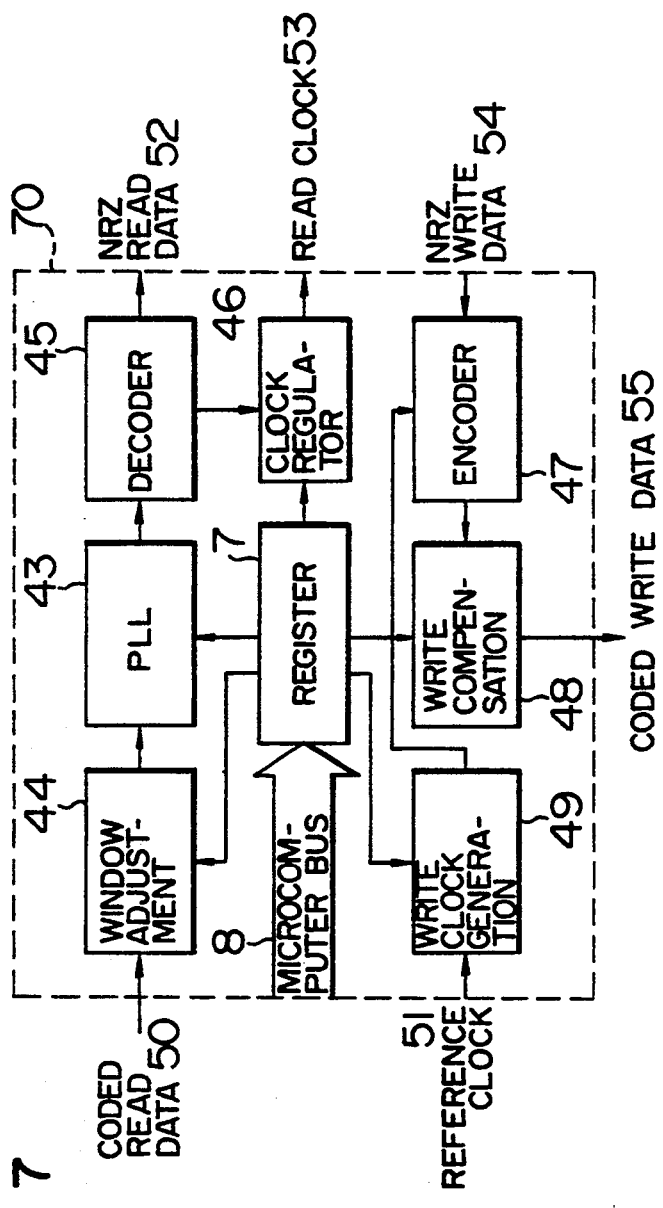
FIG. 7 is a block diagram showing a configuration of a data control circuit.

FIG. 7 shows an example in which a phase sync circuit according to the present invention is integrated with a peripheral function block. This system comprises, in addition to the PLL 43 and the register 7, an encoder 47 for conversion into a recording code and the opposite conversion, window regulation means 44 for regulating the phase of the code read data 50, clock regulation means 46 for converting the system clock and the data transfer clock, write clock generation means 49 for generating a clock of a desired write frequency on the basis of the data transfer clock, write compensator means 48 for compensating the effect of the peak shift, etc., at the time of writing, and the microcomputer bus 8.

In this control circuit 70, the register 7 regains the information on the regulation switching signal for other blocks in addition to the optimum value of the PLL 43 thereby to maintain the whole system at an optimum condition all the time.

The control circuit 70 preferably includes a magnetic disk as LSI. In this case, a resistor R or a capacitor C for switching the characteristics used for the LSI may alternatively be connected as an external element. This is because it is considered difficult to provide a high-accuracy resistor or a capacitor in the LSI.

Figure 8:
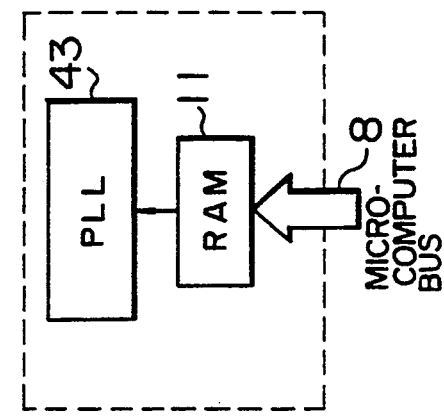
FIG. 8 is a block diagram showing a configuration of another data control circuit.

FIG. 8 shows an example in which the RAM 11 is provided independently as an exclusive means for storing the information for setting the PLL 43. In this case, the data transfer using the microcomputer bus 8 to the control circuit 70 is eliminated, thereby saving the time required for switching.

Figure 9:
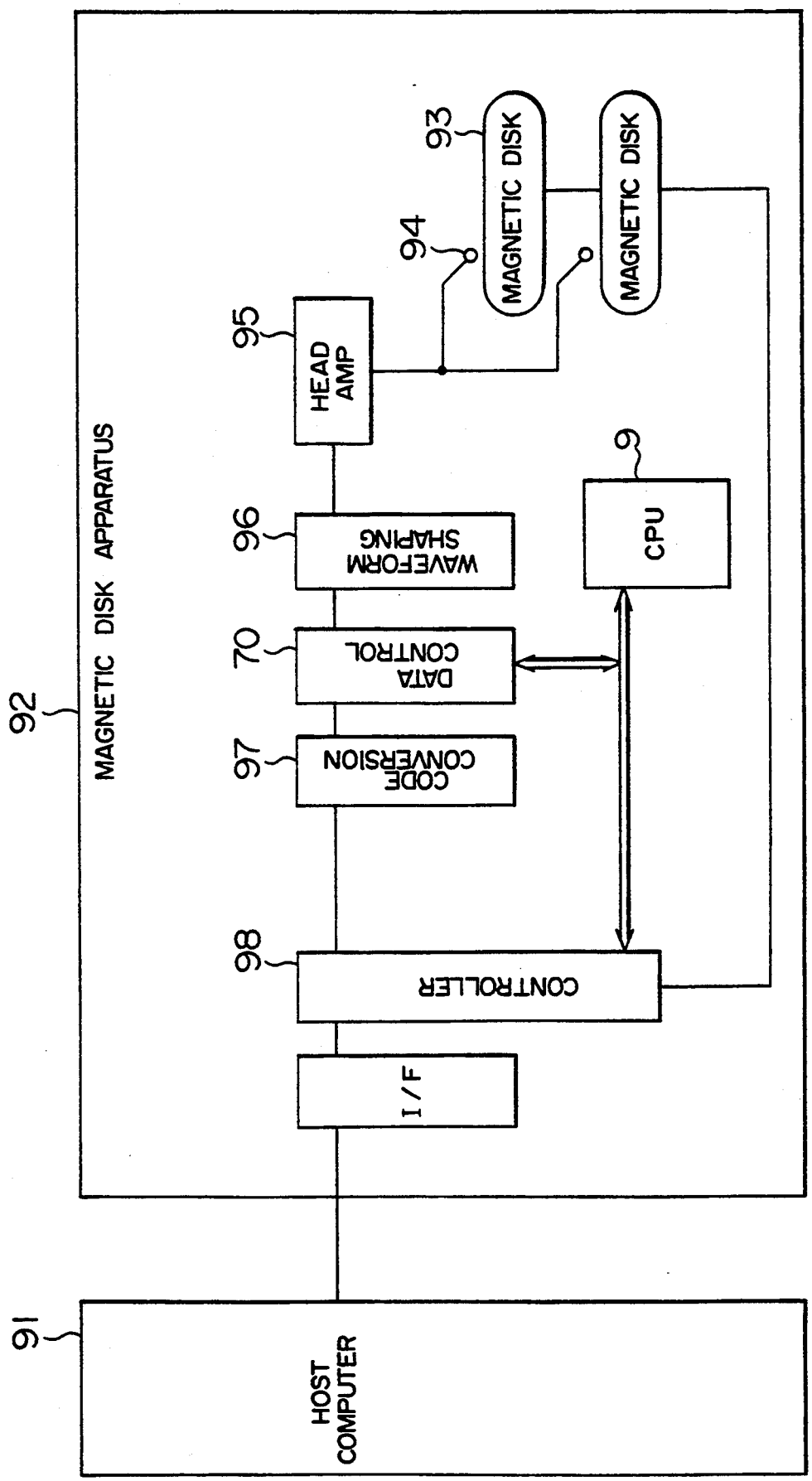
FIG. 9 is a block diagram showing a configuration of an information processing circuit.

A configuration of an information processing system according to the present embodiment is shown in FIG. 9.

This system comprises a host computer 91 and a magnetic disk unit 92. The magnetic disk unit 92, in turn, includes a magnetic disk 93, a controller 98 of the mangetic disk, a magnetic head 94, a head amplifier 95 for amplifying an electrical signal representing the data detected by the magnetic head, a waveform shaping means 96 for shaping the electrical waveform of the amplified data, the data control circuit 70, code conversion means 96 and a CPU 9 for controlling the whole system.

The foregoing embodiment has been explained with reference to an application to the magnetic disk unit of a phase sync circuit to facilitate the understanding. The present embodiment, however, is equally applicable to memory means such as an optical disk storage apparatus or a magneto-optic disk storage apparatus used with other disk-type storage media.

Also, the phase sync circuit,under consideration is realizable with equal effect by an information processing system having a variable data speed.

Further, the four switching circuits included in the phase comparator means 2, the charge pump 3, the filter means 4 and the voltage-controlled oscillator means 5 respectively may be separated from respective circuit means as independent devices or may be integrated as a single module.

As described above, according to the first feature of the present invention, a phase sync circuit is provided which is capable of stably operation against all data speeds by switching the PLL characteristics to optimal conditions in accordance with the data speed.

Figure 10:
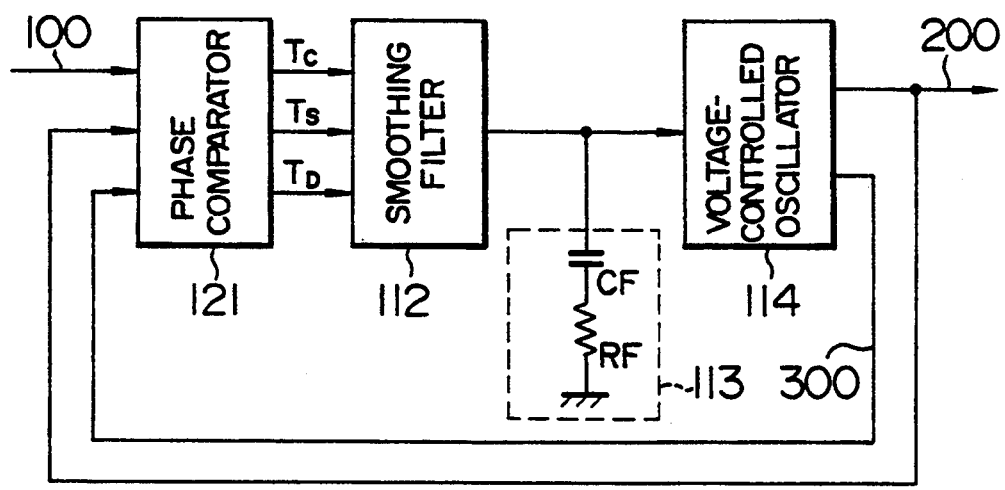
FIG. 10 is a block diagram showing another embodiment of the phase sync circuit.

FIG. 10 shows a configuration of another embodiment of the phase sync circuit having the second feature of the present invention.

This phase sync circuit comprises a phase comparator 121 for detecting the phase difference between an input pulse signal 100, an output signal 200 and an opposite-phase output signal 300, a smoothing filter 112 for smoothing the output signals $T_C$, $T_S$, $T_D$ of the phase comparator 121, a loop filter 113 for converting the output of the smoothing filter 112 to a voltage and determining the characteristics of the phase sync circuit, and a voltage-controlled oscillator 114 for changing the frequencies of the output signal 200 and the opposite-phase output signal 300 by the output voltage of the loop filter 113.

The loop filter 113, which is comprised of the resistor $R_F$ and the capacitor $C_F$, may of course be replaced with equal effect by a loop filter having a different configuration.

Figure 20:
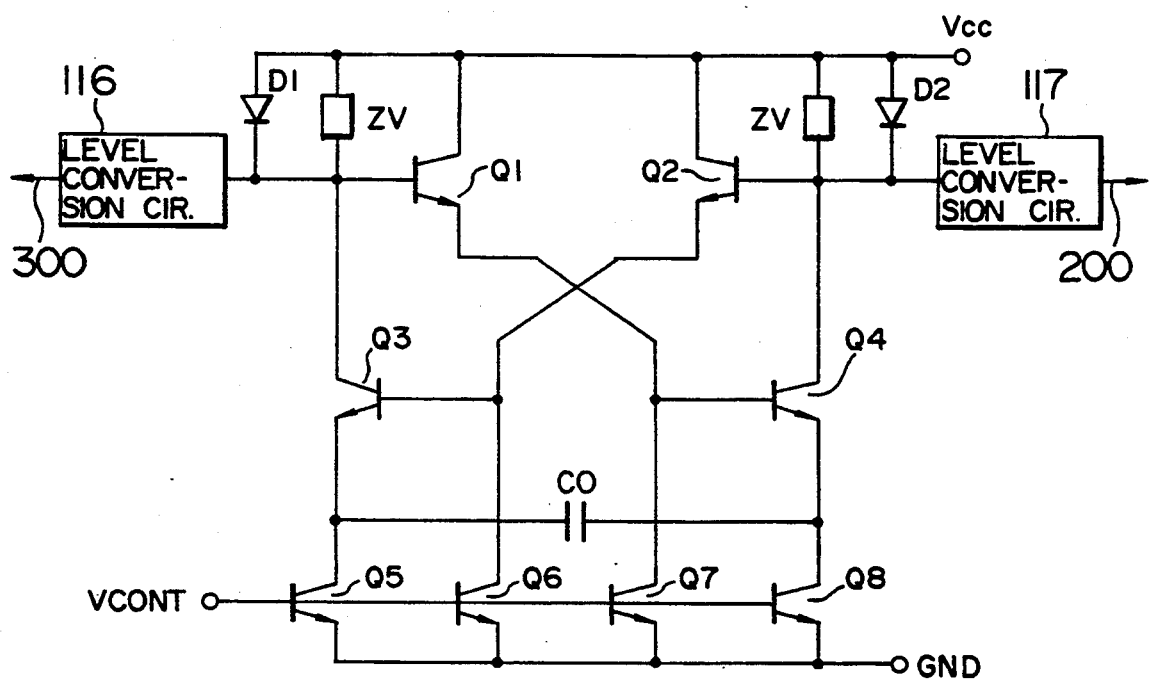
FIG. 20 is a circuit diagram showing a configuration of voltage-controlled oscillator.

FIG. 20 shows a configuration of the voltage-controlled oscillator of this phase sync circuit.

The voltage-controlled oscillator 114 includes current source transistors Q5, Q6, Q7, Q8, switching transistors Q3, Q4, emitter-follower transistors Q1, Q2, a load resistor Zv, diodes D1, D2, level shift circuits 116,117 and a timing capacitor CO. The frequency of the output signal 200 and the opposite-phase output signal 300 are changed by the control voltage Vcont.

Figure 21:
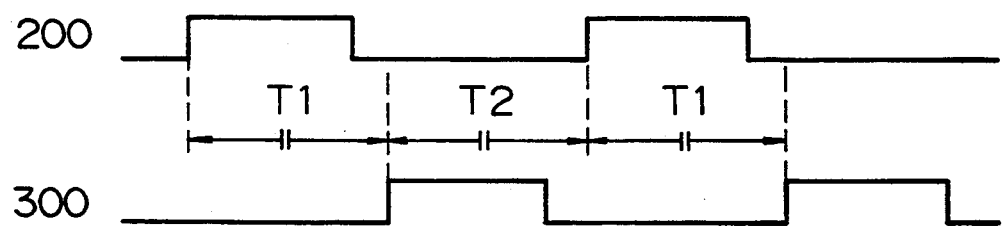
FIG. 21 is a time chart representing the operation of the voltage-controlled oscillator.

This voltage control circuit, due to the symmetry of the circuit configuration as shown in FIG. 21, is such that even when the duty factor of the output signal 200 and the opposite-phase output signal 300 undergoes a change, the time length from the leading edge of the output signal 200 to the leading edge of the opposite-phase output signal 300 remains equal to one half the period of the output signal 200. The interval as viewed between trailing edges, of course, becomes one-half of a period in similar fashion.

Figure 11:
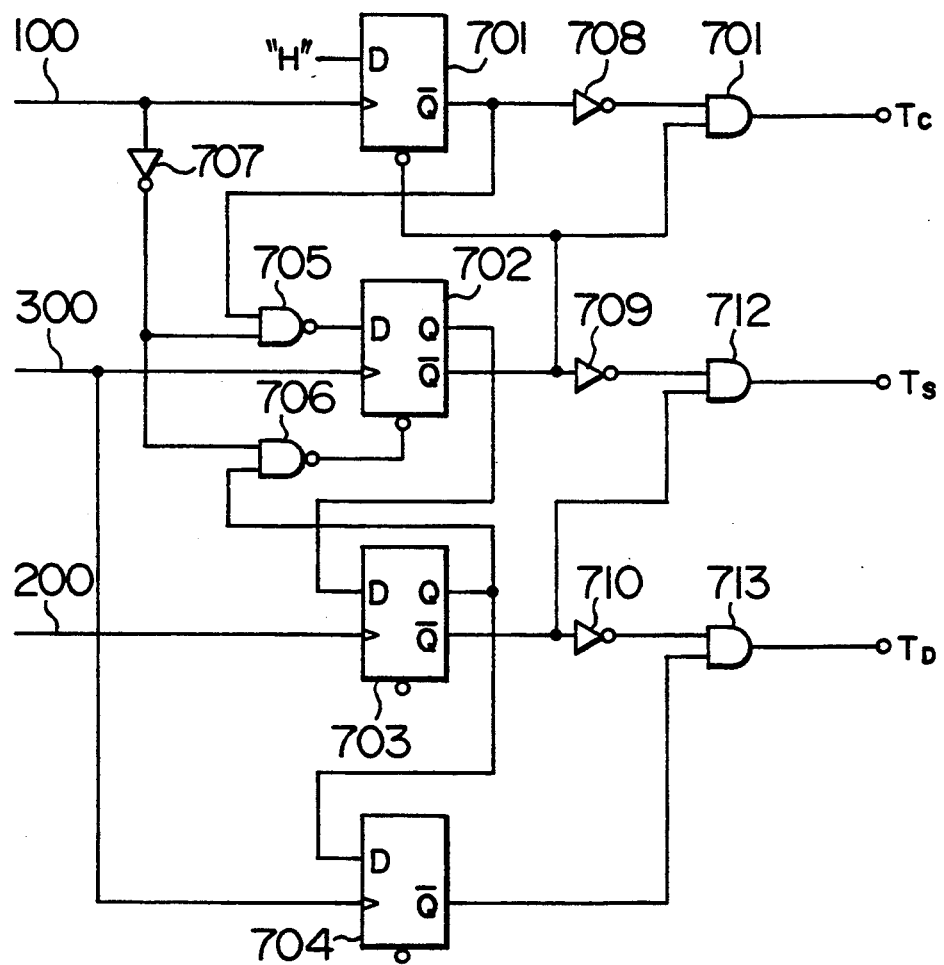
FIG. 11 is a circuit diagram showing a configuration of a phase comparator.

Now, a configuration of the phase comparator 121 is shown in FIG. 11. The phase comparator 121 includes D-type flip-flops 701, 702,703, 704, NAND gates 705, 706, inverter gates 707, 708, 709, 710 and AND gates 711, 712,713. The input signals thereto include an input pulse signal 100, and an output signal 200 and an opposite-phase output signal 300 of the voltage-controlled oscillator. On the other hand, the output signals include $T_C$, $T_S$ and $T_D$.

Figure 12:
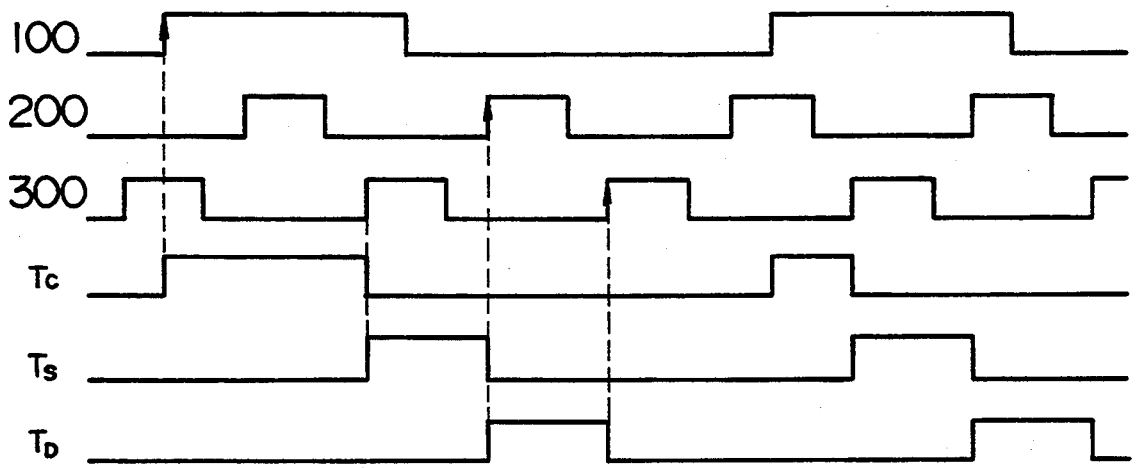
FIG. 12 is a time chart representing the operation of the phase comparator.

FIG. 12 shows a timing chart of the operation of the phase comparator 121.

First, the $T_C$ signal becomes "H" state at the leading edge of the input pulse signal 100, and "L" state at the leading edge of the next-arriving opposite-phase output signal 300. In the process, the $T_S$ signal becomes "H" at this timing, and "L" at the leading edge of the immediately-following output signal 200. Further, the $T_D$ signal becomes "H" at this timing, and "L" at the leading edge of the opposite-phase output signal 300 that arrives at the next moment.

Figure 13:
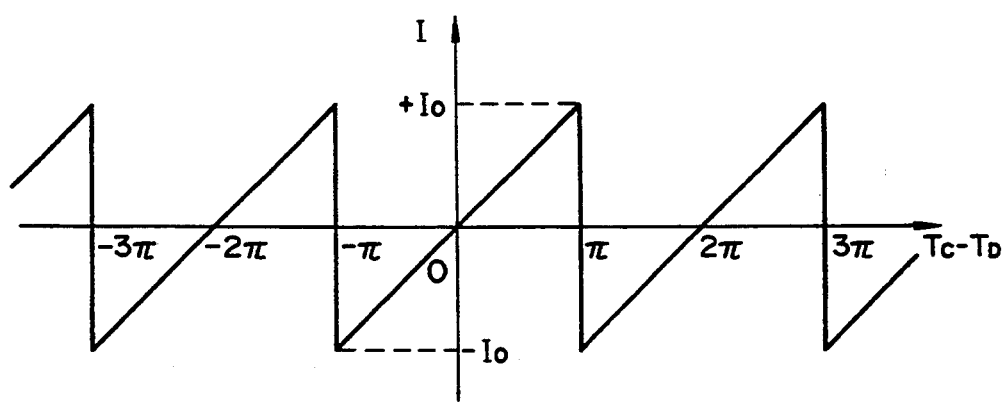
FIG. 13 is a diagram showing the characteristics of a smoothing filter.

Upon operation of the phase comparator in this way, the pulse width of the $T_S$ and $T_D$ signals becomes one-half of the period of the output signal 200 regardless of the duty factors of the output signal 200 or the opposite-phase output signal 300. As a result, the output current characteristic of the smoothing filter 112 against the phase difference between the input pulse signal 100 and the output signal 200 is stabilized regardless of the duty factor of the output signal of the voltage-controlled oscillator 114 (See the description of the smoothing filter in FIG. 13).

Also, the transient characteristic of the smoothing filter 112 is capable of being kept constant regardless of the duty factor of the output signal of the voltage-controlled oscillator 114.

Now, explanation will be made about another phase sync circuit according to the present invention.

Figure 14:
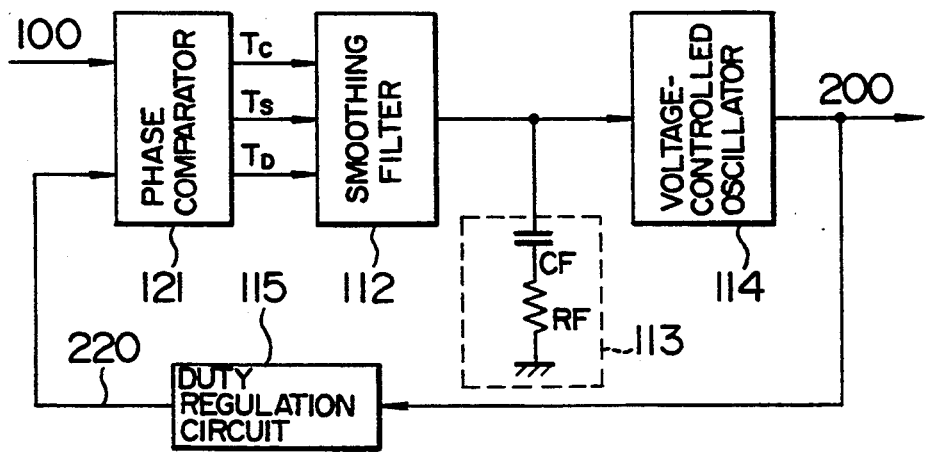
FIG. 14 is a block diagram showing another embodiment of the phase sync circuit.

A configuration of the phase sync circuit according to the present embodiment is shown in FIG. 14.

The phase sync circuit according to the present embodiment comprises a phase comparator 121, a smoothing filter 112, a loop filter 113, a voltage-controlled oscillator 114 and a duty regulation circuit 115.

The phase comparator 121 compares the input pulse signal 100 with the phase of the output clock 220 of the duty regulation circuit 115 and produces the phase difference therebetween in the form of $T_C$, $T_S$ and $T_D$ signals. The smoothing filter 112, the loop filter 113 and the voltage-controlled oscillator 114 operate in the same manner as the corresponding devices shown in FIG. 22 respectively. The duty regulation circuit 115 corrects the duty factor of the output signal 200 of the voltage-controlled oscillator 114 to 50%, and produces it as an output clock 220.

Figure 15:
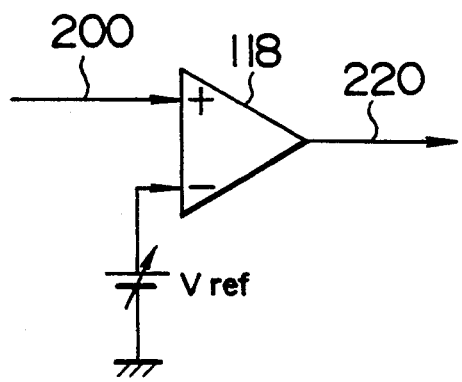
FIG. 15 is a circuit diagram showing a configuration of a duty regulation circuit.

A configuration of the duty regulation circuit 115 is shown in FIG. 15.

In FIG. 15, the differential comparator 118 compares the output signal 200 of the voltage-controlled oscillator 114 with the level of the reference voltage Vref, and if the output signal 200 is higher than the reference voltage Vref, sets the output clock 220 to a high level, while if the output signal 200 is lower than the reference voltage Vref, on the other hand, reduces the output clock 220 to a low level.

Figure 17:
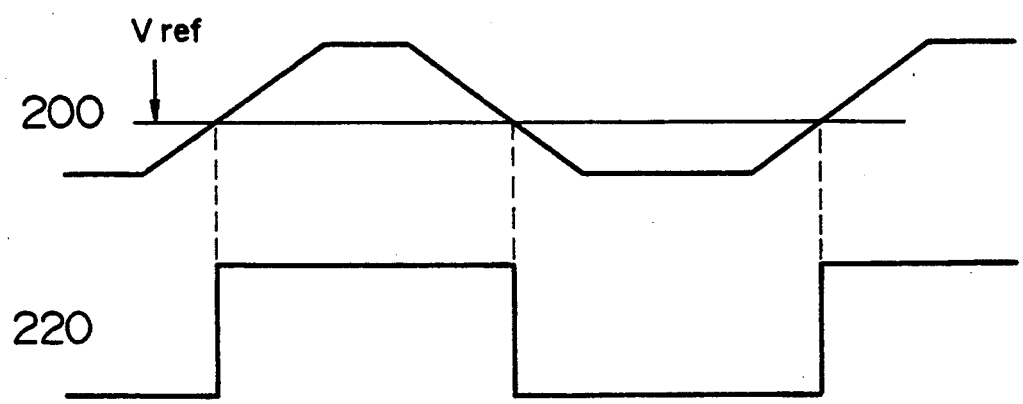
FIG. 17 is a time chart representing the operation of the duty regulation circuit.

FIG. 17 shows a timing chart of the operation of the duty regulation circuit 115.

As shown in FIG. 17, as long as the deviation of the duty factor of the output signal 200 is less than a predetermined extent, if not 50%, the output clock 220 having the duty factor of 50% is produced by appropriately regulating the reference voltage Vref.

Figure 16:
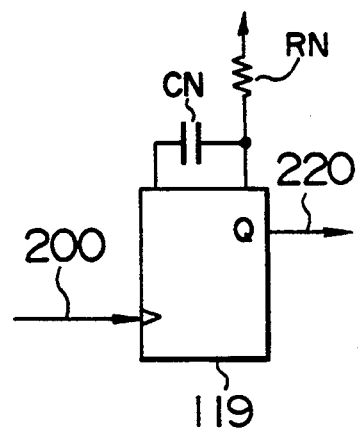
FIG. 16 is a circuit diagram showing a configuration of another duty regulation circuit.

Another configuration of the duty regulation circuit 115 is shown in FIG. 16.

In this configuration, a monostable multivibrator 119 is used as the duty regulation circuit 115, and a pulse width T required for triggering the output signal 200 is made available by regulating the time constant due to the capacitance $C_N$ and the resistance $R_N$. In this case, the pulse width T is set to one-half of the period of the output signal 200.

Figure 18:
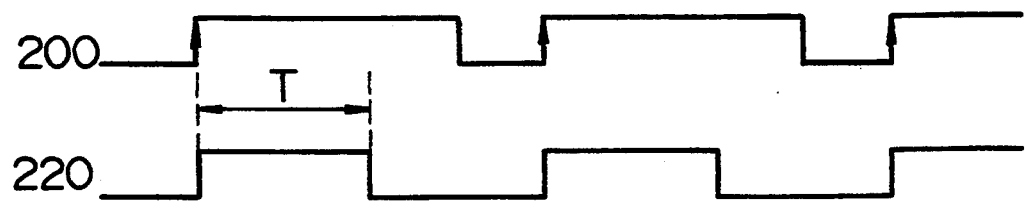
FIG. 18 is a time chart representing the operation of another duty regulation circuit.

As a consequence, as shown in the operation timing chart of FIG. 18, an output clock 220 having a duty factor of 50% is obtained against an output signal 200 whose duty factor is not 50%. As a result, the output current characteristic of the smoothing filter 112 is stabilized regardless of the duty factor of the output signal of the voltage-controlled oscillator 114. It is also possible to produce a stable transient characteristic of the smoothing filter 112 regardless of the duty factor of the output signal of the voltage-controlled oscillator 114.

A phase sync circuit according to still another embodiment of the present invention will be explained.

In this embodiment, the fluctuations in the transient characteristics of the smoothing filter 112 due to the duty factor of the output signal 200 of the voltage-controlled oscillator 114 are corrected by the smoothing filter 112. Therefore, the phase comparator 121, the loop filter 113, the voltage-controlled oscillator 114 operate in the same manner as the corresponding devices in the conventional phase sync circuit (See FIG. 22) described above. Also, the general configuration of this embodiment is similar to that of the conventional phase sync circuit, although the internal structure of the smoothing filter 112 is different.

Figure 19:
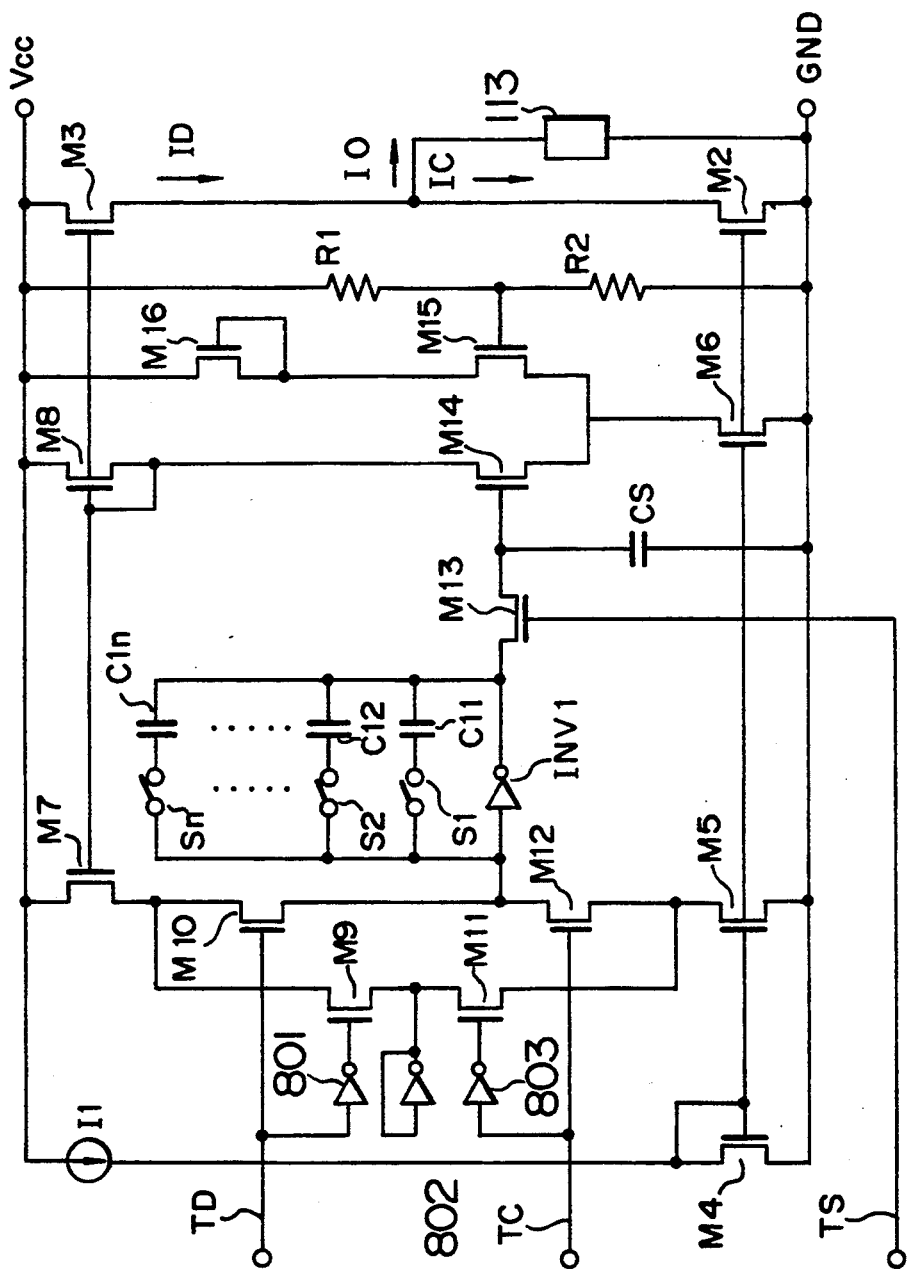
FIG. 19 is a circuit diagram showing a configuration of a smoothing filter.

A configuration of the smoothing filter 112 of the phase sync circuit according to the present embodiment is shown in FIG. 19.

The smoothing filter 112, as shown in FIG. 19, includes a current source $I_1$, invert logic circuits 801, 802, 803, an INV1, MOS transistors M2, M3, M4, M5, M6, M7, M8, M9, M10, M11, M12, M13, M14, M15, M16, resistors $R_1$, $R_2$, capacitors $C_{11}$, $C_{12}$, ..., Cm, switches $S_1$, $S_2$, ... $S_n$ and a capacitor $C_S$.

This circuit, when supplied with a signal operated on the basis of the current $I_1$, takes out charges from the capacitors $C_{11}$ to $C_{ln}$, and pour them in when supplied with the $T_D$ signal. When the $T_S$ signal is supplied thereto, on the other hand, M13 turns on and charges are stored in the capacitor $C_S$. The voltage of this capacitor $C_S$ is converted into a current $I_D$ by a differential amplifier configured of M14 and M15, and the difference $I_0$ with the current $I_C$ generated from the current source $I_1$ is applied to the loop filter 113.

As shown in equation (1), the sampling servo gain G1 of the smoothing filter 112 is a function of $T_D$ and $C_1$, and therefore, when the duty factor of the output appropriate number of switches $S_1$ to $S_n$ are turned on, so signal 200 is not 50% but $T_D$ undergoes a change, an that the total sum $C_1$ of the capacitance is changed thereby to correct the variation of $T_D$. As a result, the gain G1 is maintained constant regardless of the duty factor of the output signal of the voltage-controlled oscillator 114.

As explained above, in the phase sync circuit shown in FIGS. 10 to 14, the signal $T_D$ applied to the smoothing filter is kept as a pulse signal having a time width one-half the period of the output signal of the voltage-controlled oscillator, not dependent on the duty factor of the output signal of the voltage-controlled oscillator 114. Thus, the gain G1 is kept constant, thereby maintaining the transient characteristics of the smoothing filter also constant. The output current characteristic of the smoothing filter is fixed at the same time.

Figure 22:
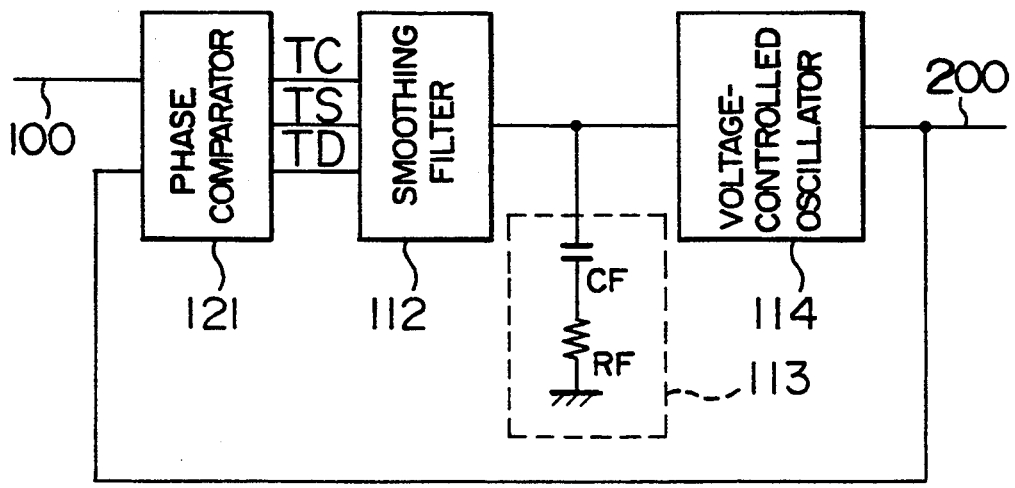
FIG. 22 is a block diagram showing a configuration of a conventional phase sync circuit.
Figure 23:
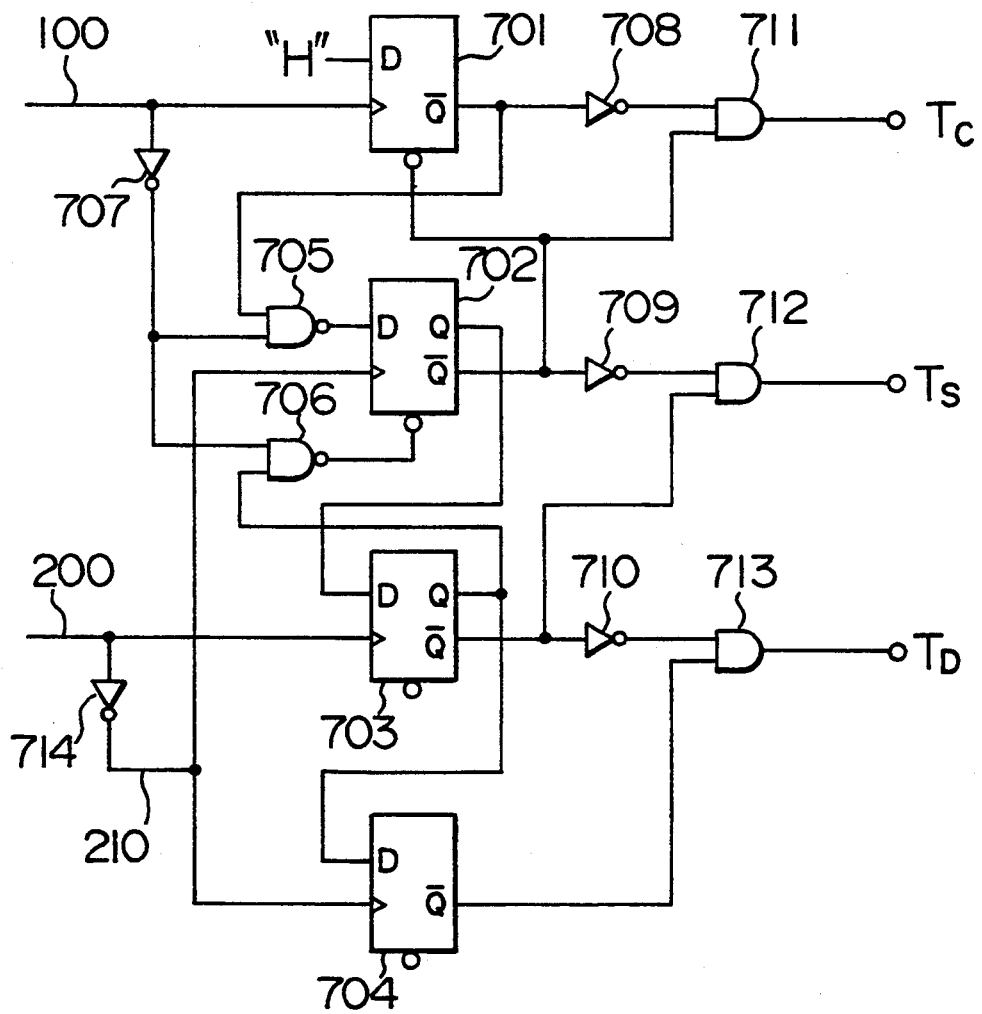
FIG. 23 is a circuit diagram showing a configuration of a phase comparator.
Figure 24:
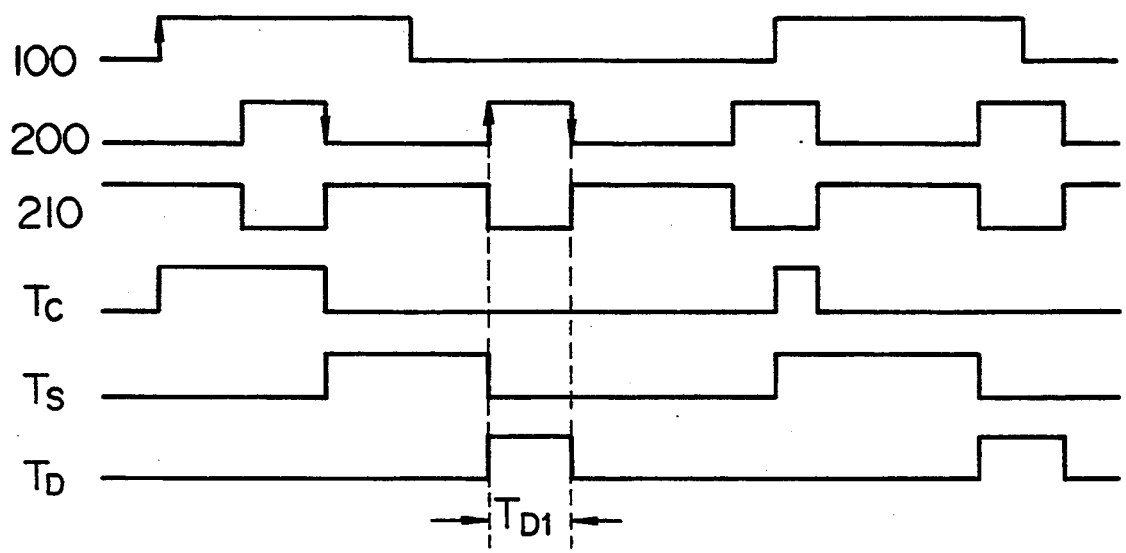
FIGS. 24 and 25 are time charts representing the operation of the phase comparator.
Figure 25:
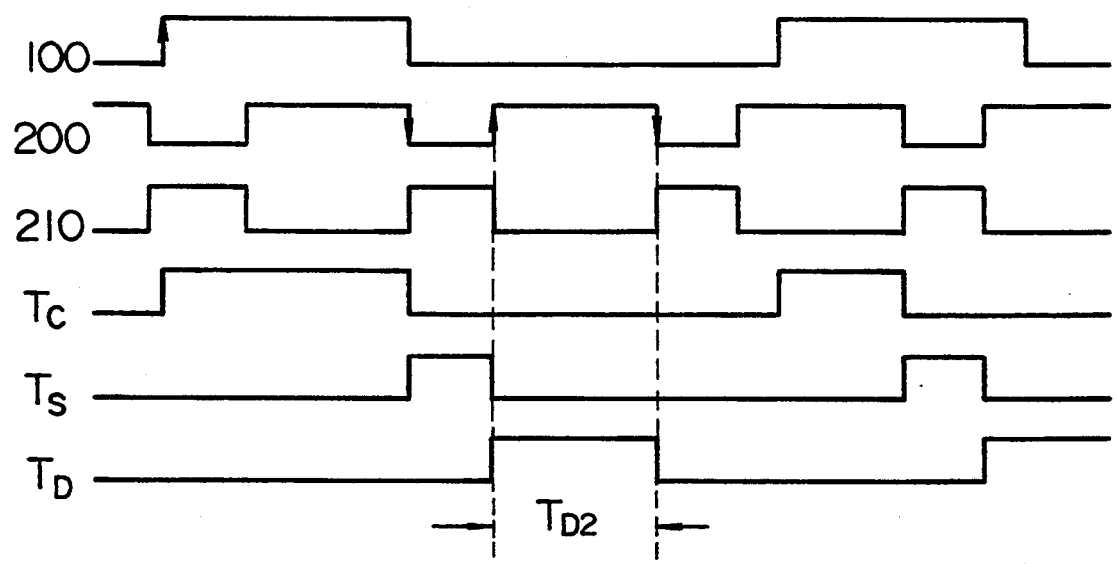
Figure 26:
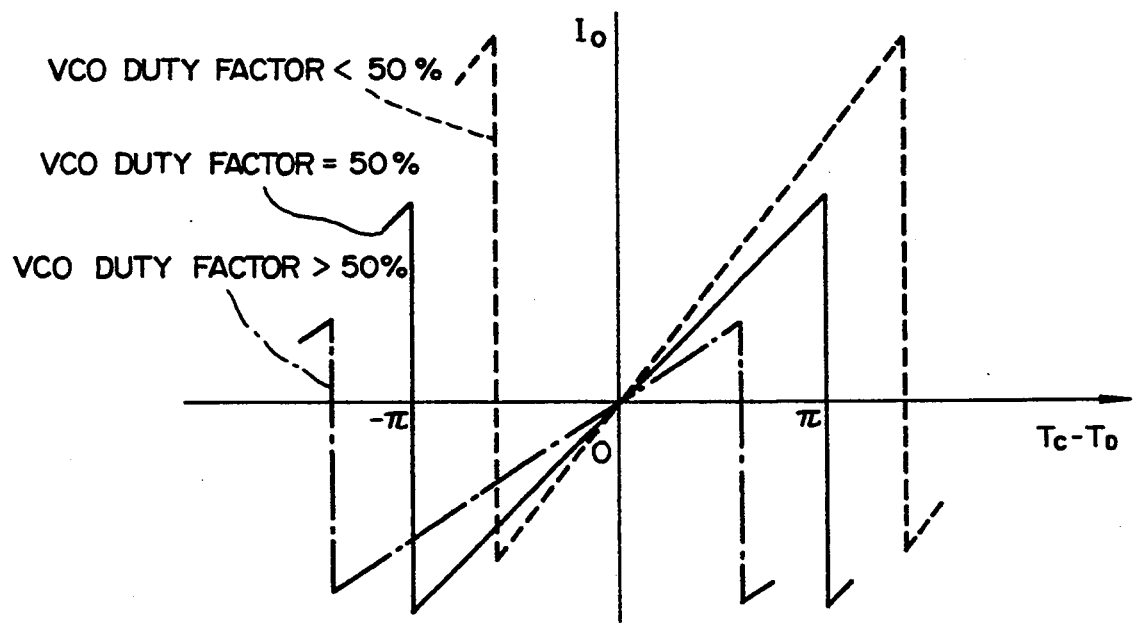
FIG. 26 is a characteristic diagram showing the characteristics of another smoothing filter.
Figure 27:
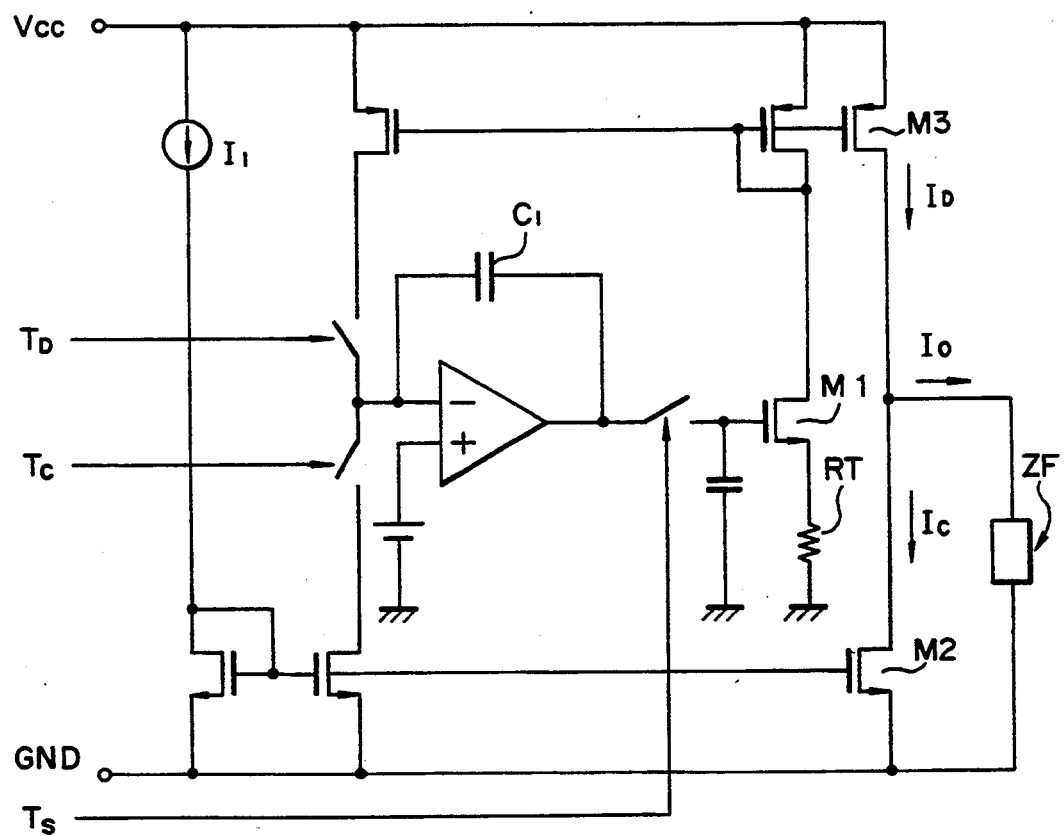
FIG. 27 is a circuit diagram showing a configuration of another smoothing filter.

Further, in the phase sync circuit described with reference to FIG. 22, it is possible to produce a constant gain G1 regardless of the duty factor of the output signal of the voltage-controlled oscillator by correcting the variation of TD having an effect on G1. In this way, the transient characteristic of the smoothing filter is kept fixed.

According to the above-mentioned three embodiments of the phase sync circuit, the sampling servo gain G1 is kept always unity without regard to the duty factor of the output signal 200 of the voltage-controlled oscillator 114. At the same time, the range of linear phase comparison becomes equal on advanced and retarded sides, thus dampening the reduction in capture range. Further, the loop gain of the phase sync circuit is kept constant without any fluctuations, thus producing a stable output signal of the votlage-controlled oscillator. As a result of these effects, the margin loss in data reproduction is reduced in an application, for example, to the magnetic disk apparatus.

Furthermore, the aforementioned three embodiments of phase sync circuits have the functions thereof realized mainly by digital signal processing and therefore are easily incorporated in an LSI.

The provision of the phase sync circuits described above as three embodiments permits a digital signal processing unit to process digital signals with a stable clock.

As will be seen from above, according to the second feature of the present invention, there is provided a phase sync circuit which always operates in stable manner independently of the pulse width $T_D$ of the output signal 200.

Figure 28:
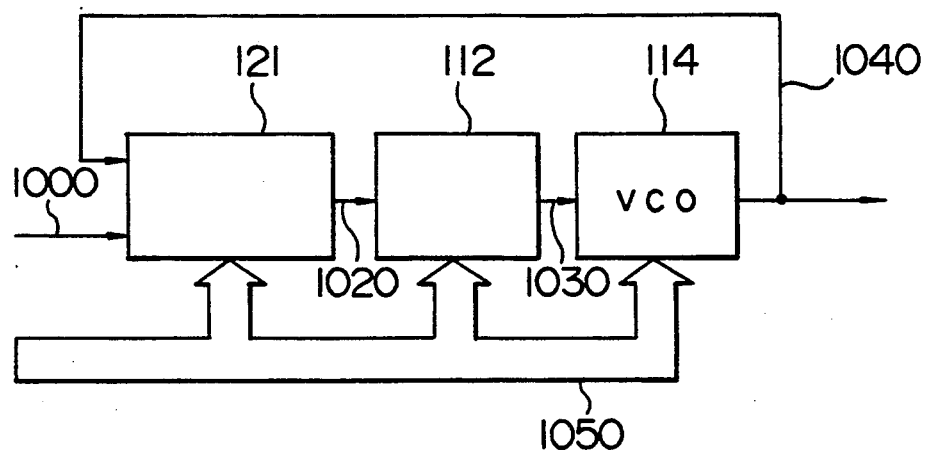
FIG. 28 is a circuit diagram showing a configuration of another phase sync circuit.

A configuration of another phase sync circuit having the third feature of the present invention is shown in FIG. 28.

A PLL includes a phase comparator 121, a filter 112 and a VCO 114. According to the PLL of this embodiment, a charge pump is built in the phase comparator 121.

Figure 29:
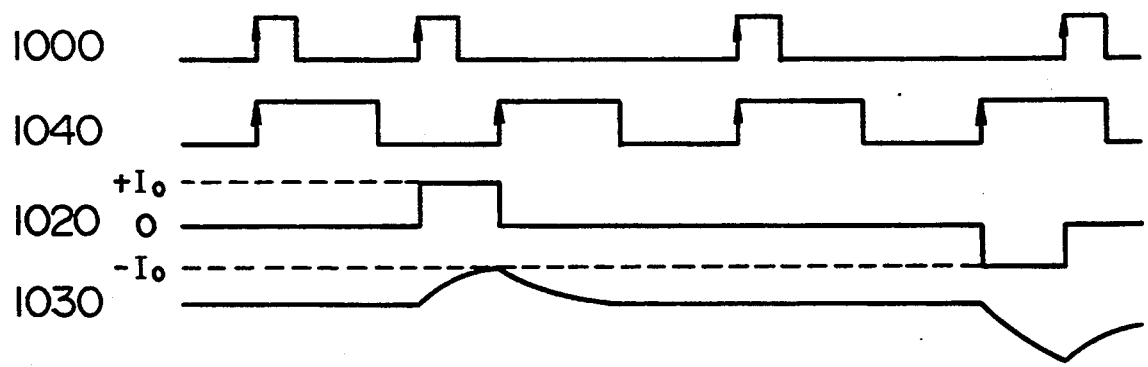
FIG. 29 is a time chart representing the operation of the phase sync circuit.

FIG. 29 shows an operation timing of the PLL.

The phase comparator 121 compares the phases of an input pulse signal 1000 and the output clock 1040 of the VCO 114, and when the phase of the input pulse signal 1000 is advanced from that of the output clock 1040, the current Io is supplied to the filter 112 for such a time length as corresponding to the phase difference between the two signals. If the phase of the input pulse signal 1000 lags behind that of the output clock 1040, on the contrary, the current Io is taken out of the filter 112 for such a time length as corresponding to the particular phase difference.

Also, in the case where the input pulse signal 1000 is in phase with the output clock 1040, in contrast, the operation of the filter 112 remains unaffected.

The phase comparator 121, the filter 112 and the VCO 114 making up the PLL are connected with a control bus 1050 respectively, whereby the constant of each block is set.

Figure 30:
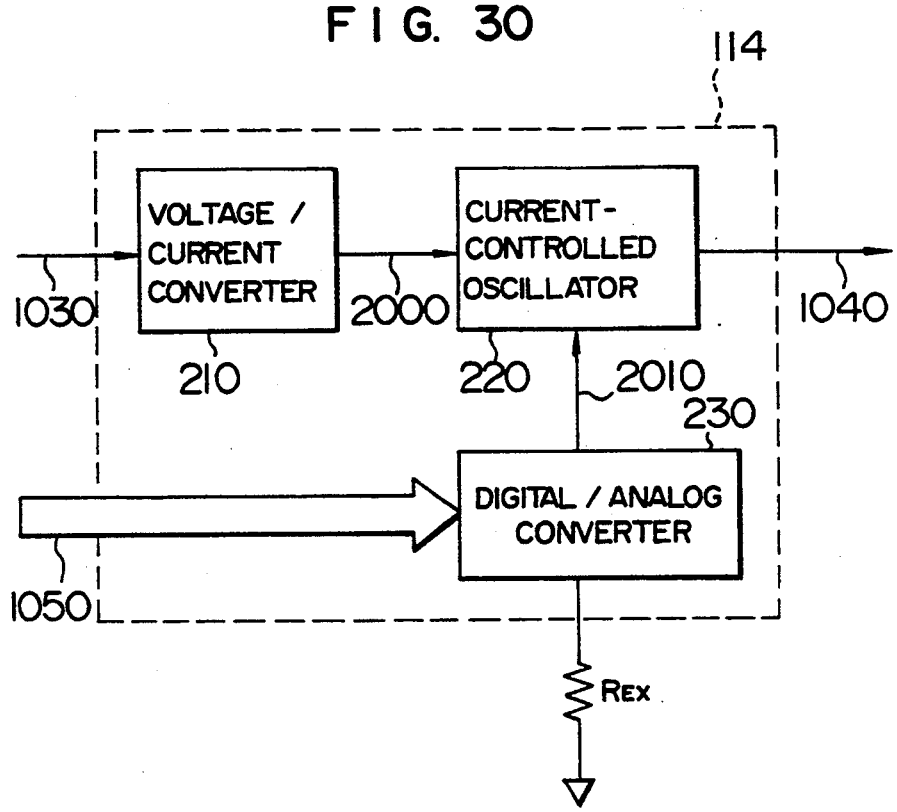
FIG. 30 is a block diagram showing a configuration of another voltage-controlled oscillator.

FIG. 30 shows an internal configuration of the VCO 114.

As shown, the VCO 114 includes a voltage-current converter 210, a current-controlled oscillator 220 and a digital-analog converter 230.

In FIG. 30, a control voltage 1030 is applied to the voltage-current converter 210 and is converted into a control current 2000.

This control current 2000 is applied to the current-controlled oscillator 220 to control the frequency of the output clock 1040.

The digital-analog converter 230, on the other hand, generates and supplis to the current-controlled oscillator 220 a reference current 2010 for setting a free-running frequency in accordance with an instruction 1050 transmitted along a control bus on the basis of the current generated in a reference resistor Rex.

Figure 32:
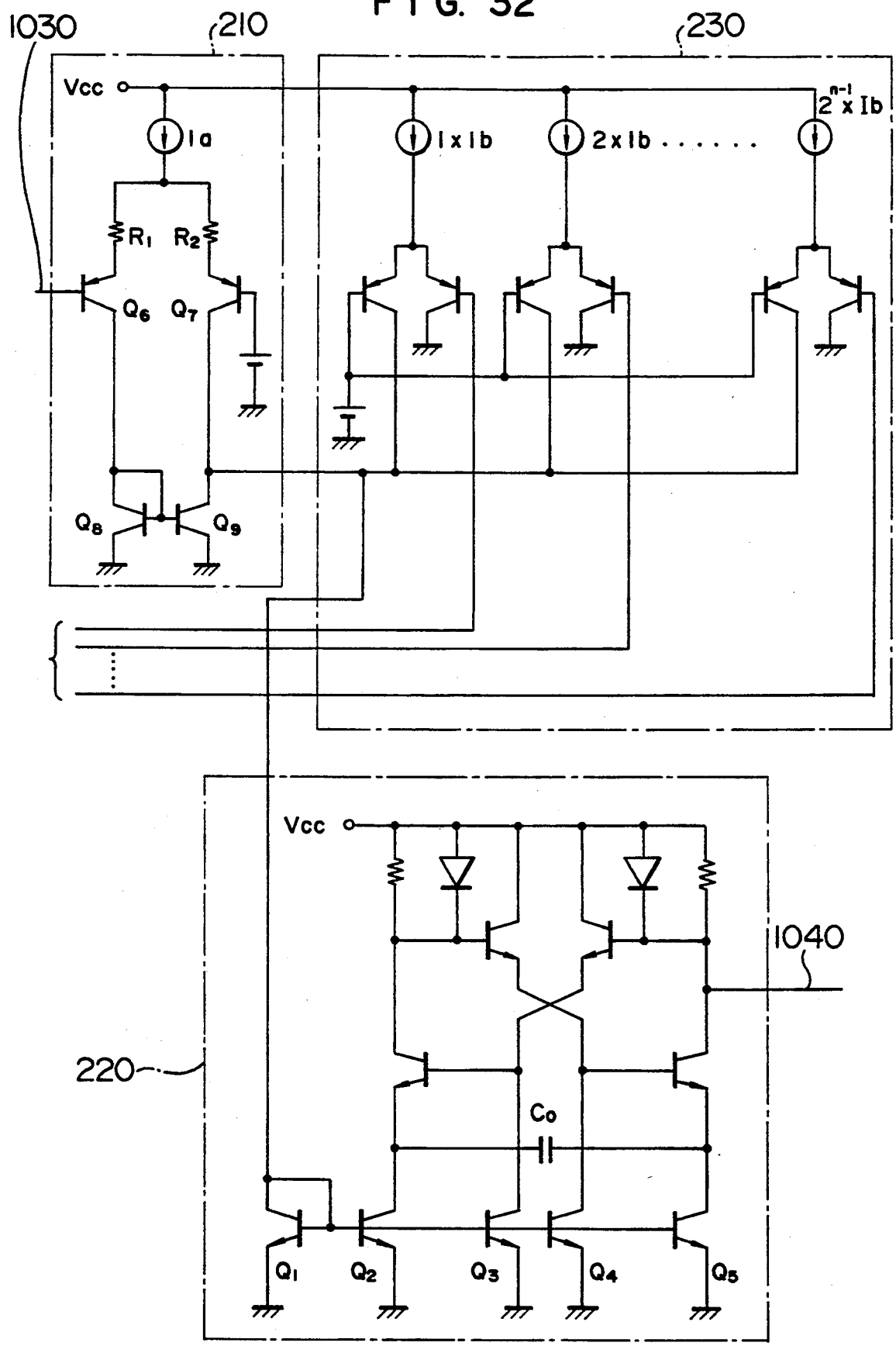
FIG. 32 is a circuit diagram showing another voltage-controlled oscillator in detail.

FIG. 32 shows a specific circuit configuration of the VCO 114.

In FIG. 32, numeral 210 designates a voltage-current converter, numeral 220 a current-controlled oscillator and numeral 230 a digital-analog converter.

As shown, the current-controlled oscillator 220 is a well-known emitter-coupled astable multivibrator. Transistors Q1, Q2, Q3, Q4, Q5 make up a current mirror for returning the .sum current Ic of the control current 2000 and the reference current 2010.

In the process, the frequency $f_0$ of the output clock 1040 is given by $$f_0 = \frac{I_C}{4C_0 \cdot V_{BE}}$$

where $V_{BE}$ is a base-emitter voltage of the transistor.

The voltage-current converter 210 includes a differential amplifier having transistors Q6, Q7, resistors R1, R2 and a current source Ia, and transistors Q8, Q9 for taking out a differential current of the differential amplifier.

Further, the digital-analog converter 230, which is of a current output type, includes differential switches in the number corresponding to the number of bits of the control bus and a current source weighted in a manner corresponding to the number of bits. The total sum of the currents corresponding to the bits of the control bus 1050 is produced as a reference current 2010.

Figure 31A:
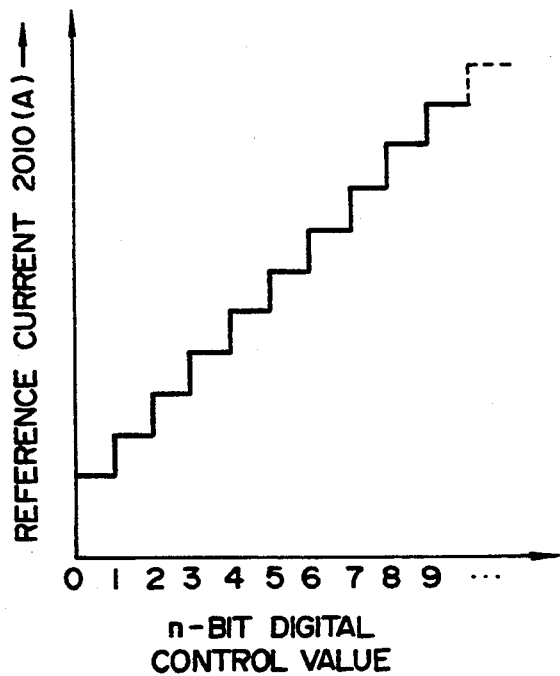
FIGS. 31A and 31B are diagrams showing the characteristics of another voltage-controlled oscillator.
Figure 31B:
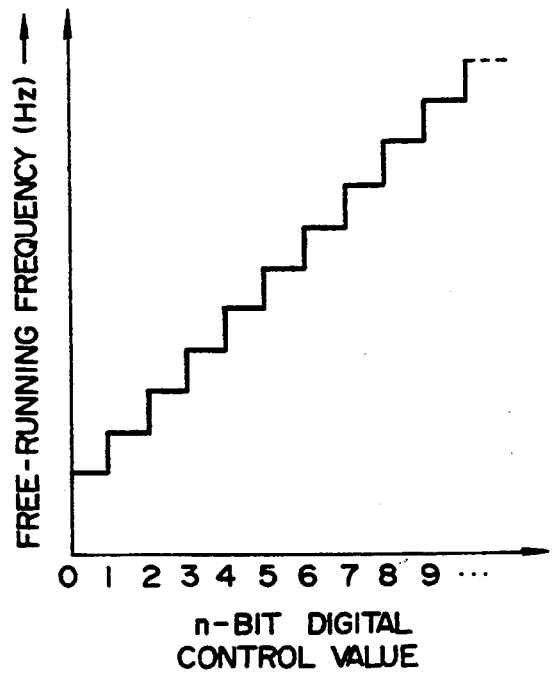

FIGS. 31A and 31B show the relationship of the reference current 2010 and the free-running frequency as against the digital control value of n bits applied from the control bus 1050. As shown, the reference current 2010 and the free-running frequency undergo a linear change in accordance with the control value of the control bus 1050.

Another configuration of the digital-analog converter 230 is shown in FIG. 33.

In FIG. 33, a transistor Mb generates a bias votlage, and transistors M1, M2, ... Mn corresponding to the n bits of the control bus respectively, are configured to increase the gate width W in predetermined magnifications.

Specifically, the gate width W of the transistor Mn is larger than the gate width of the transistor M1 by a factor of $2^{n-1}$.

The remaining transistors in the number of $(2 \times n)$ designated by other than M are used as switches to determine whether the bias voltage generated by the transistor Mb is to be applied or not to the gate of each transistor from M1 to Mn in accordance with each corresponding bit of the control bus 1050.

A digital-analog converter of another circuit system configuration may also be used as far as it is of a current output type.

Figure 34:
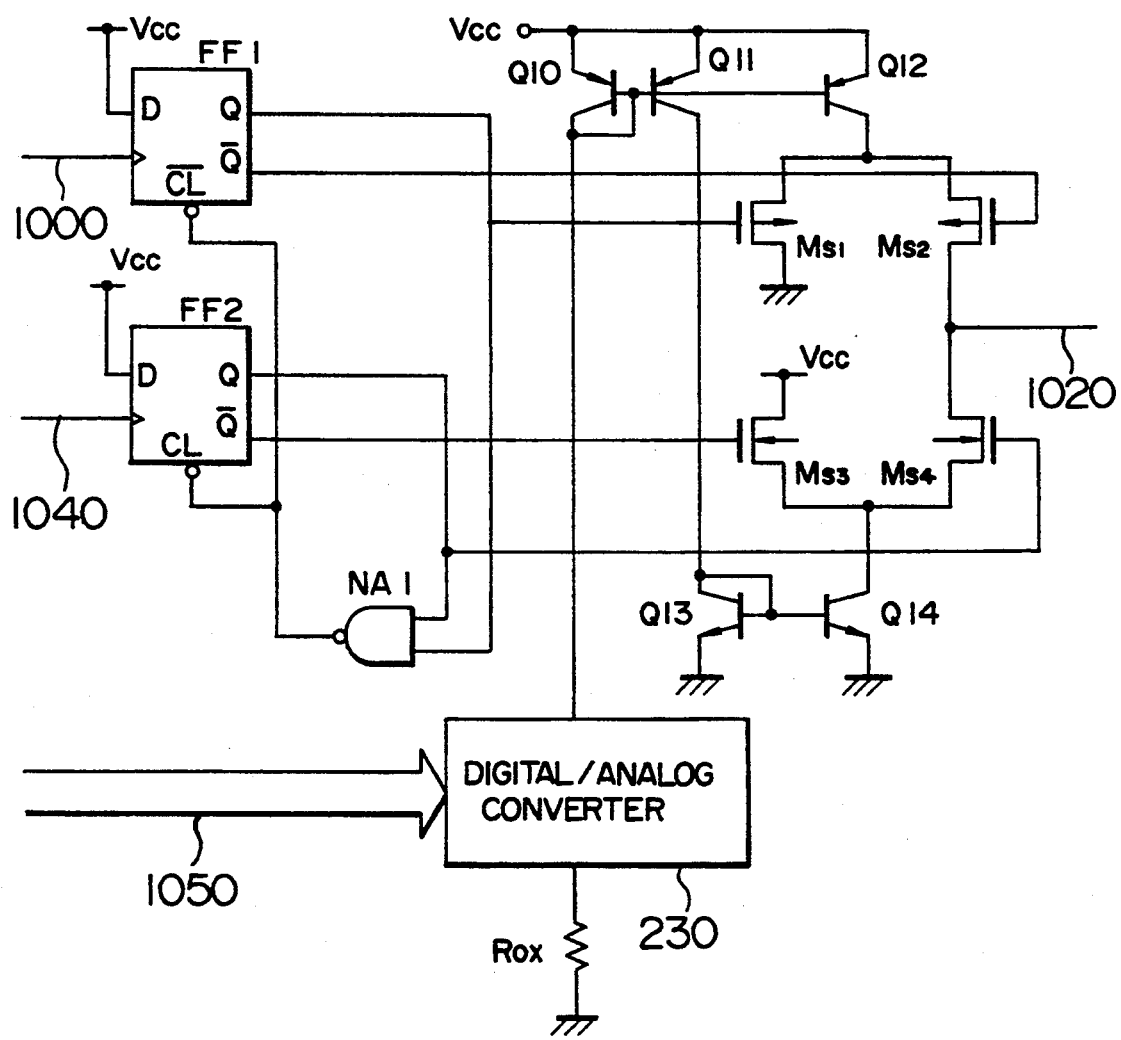
FIG. 34 is a circuit diagram showing a phase comparator in detail.

FIG. 34 shows a configuration of the phase comparator 121.

As shown, the phase comparator 121 includes flip-flops FF1, FF2, a NAND gate NA1, transistors Q10, Q11, Q12, Q13, Q14, $M_{S1}$, $M_{S2}$, $M_{S3}$, $M_{S4}$, and a digital-analog converter 230.

The flip-flops FF1, FF2 and the NAND gate NA1 are adapted for detecting the phase difference between an input pulse signal 1000 and an output clock 1040. When the phase of the input pulse signal 1000 is advanced from that of the output clock 1040, the Q output of FF1 becomes "H" for a time length corresponding to the particular phase difference, while if the phase of the input pulse signal 100 is delayed behind that of the output clock 1040, in contrast, the Q output of FF2 is kept "H" for as long a time length as corresponding to the particular phase difference.

The transistor pairs $M_{S1}$, $M_{S2}$ and $M_{S3}$, $M_{S4}$ respectively make up a differential switch for allowing the current to flow out as long as the Q output of FF1 remains "H", whereas it pulls in the current as long as the Q output of FF2 is in "H" state.

The transistors Q10, Q11, Q12 and Q13, Q14 make up a return current mirror respectively to supply the differential switch with the reference current generated in the digital-analog converter 230.

The digital-analog converter 230 may have such an internal configuration as used with the voltage-controlled oscillator 114 described above (See FIGS. 32 and 33).

In order to enable a constant to be set independently of the VCO 130, however, a number m of bits different from those of the control bus 1050 used with the VCO 130 are used while providing a reference resistor Rox independently.

It is of course possible to jointly use the control bus to make the switching operation with a single control signal.

Figure 35:
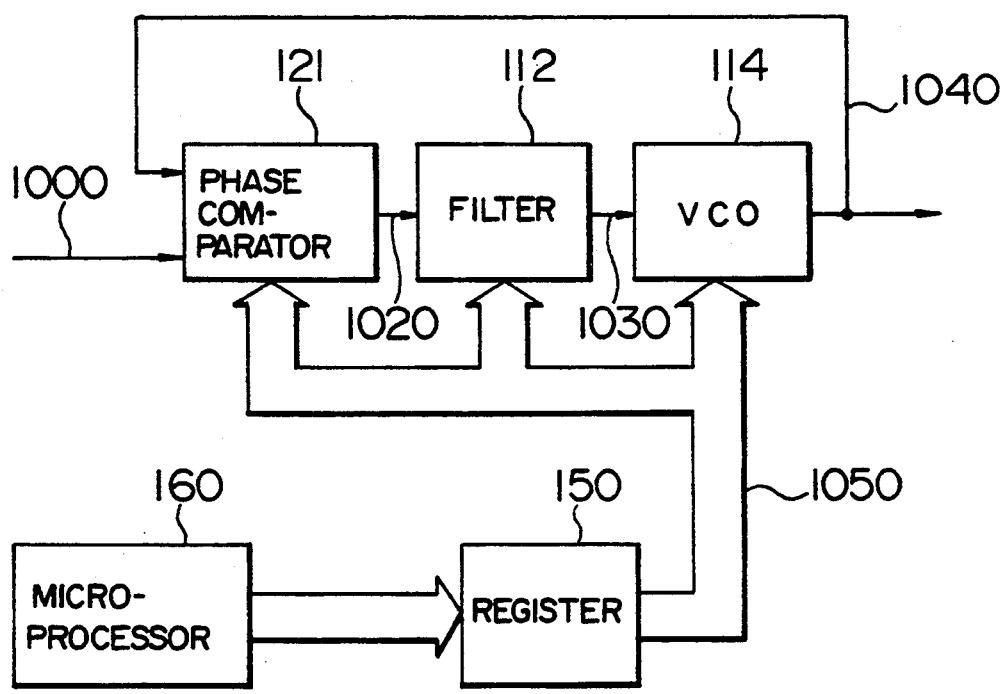
FIG. 35 is a block diagram showing a configuration of another phase sync circuit.

As an alternative, each part of the PLL may be controlled through a resistor as shown in FIG. 35.

In FIG. 35, the PLL includes a phase comparator 121, a filter 112, a VCO 114 and a register 150. The register 150 has the information written thereinto by a microprocessor 160, and the output of the register 150 makes up a control bus 1050, through which the circuit constants of the phase comparator 121, the filter 112 and the VCO 114 are set.

As described above, the PLL under consideration, which is mainly configured of semiconductor devices, has the advantage of easy integration.

Now, explanation will be made about a magnetic disk system circuit suitable for a magnetic disk apparatus in which each or all cylinders are divided into several zones and the write speed is varied from one zone to another thereby to reduce a change in linear density.

FIG. 36 shows a configuration on the read side of a magnetic disk apparatus.

As shown, the magnetic disk system circuit comprises a microprocessor 160, a non-volatile memory device 170, a disk controller 190, a decoder 200, a selector 310, a delay line 320 and a PLL 330.

In FIG. 36, an encoded signal 4000 read out of a magnetic medium 180 is applied to the delay line with taps.

Each tap of the delay line 320 is connected to the selector 310.

On the other hand, the encoded signal 4010 taken out of the center tap having a delay about one-half the maximum delay of the delay line 320 is applied to the PLL 330.

An output clock 1040 generated in the PLL 330 is applied to the decoder 200 as a timing clock for fetching the data of the decoder 200.

The non-volatile memory device 170 has stored therein selector control information for selecting a tap in optimum phase relationship with the output clock. This information is read by the microprocessor 160 and is applied to the selector 310.

As a result, even if the transfer speed of the encoded signal 4000 is changed, the circuit constants of the PLL 330 are switched by the control bus and the control information of the selector 310 by the microprocessor 160 thereby to maintain an always optimum phase relationship between the encoded signal 4020 and the output clock 1040.

It is thus possible for the decoder 200 to perform a stable decoding operation while at the same time supplying the decoded signal 4030 and the read clock 4040 to the disk controller 190.

Now, reference is had to a case in which the PLL is used for generating a write clock for the magnetic medium in the magnetic disk apparatus.

Figure 37:
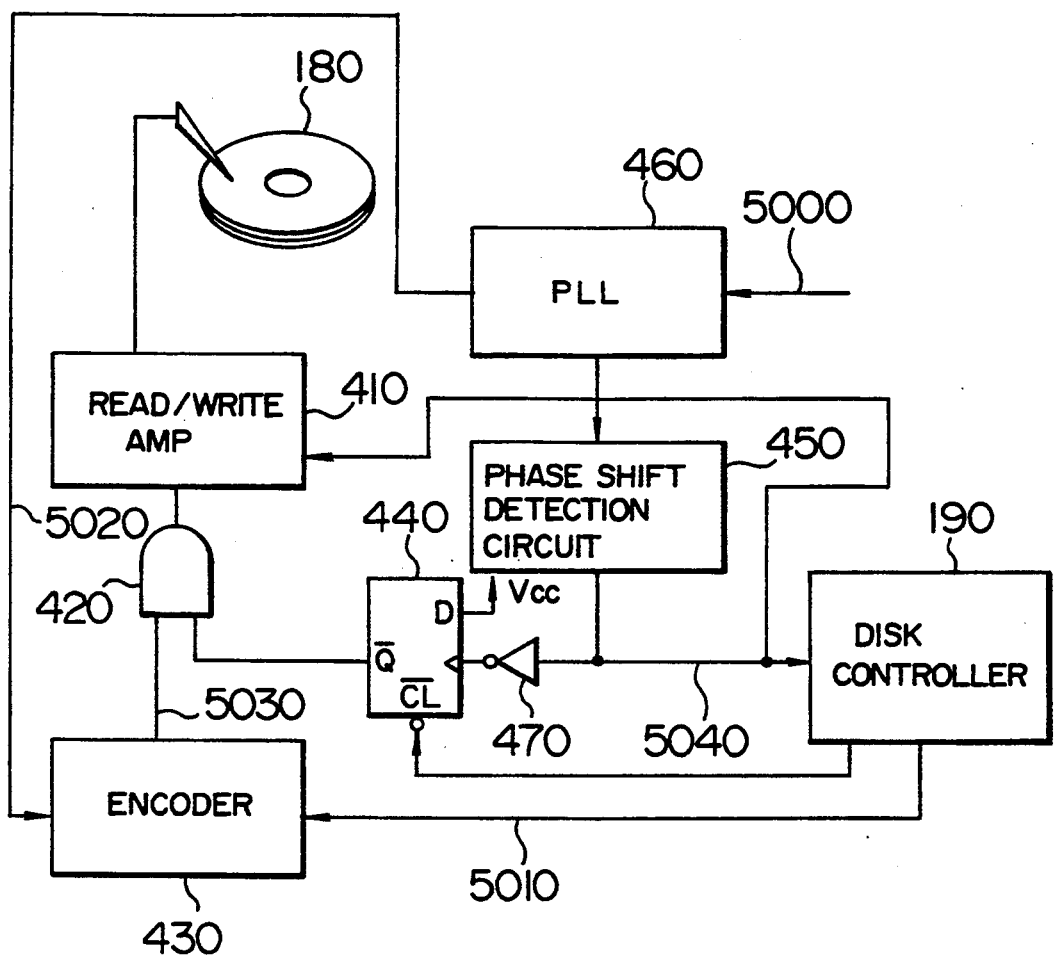
FIG. 37 is a block diagram showing a configuration on write side of a magnetic disk storage apparatus.

FIG. 37 shows a configuration on the write side of this magnetic disk apparatus.

The magnetic disk apparatus comprises a disk controller 190, a read-write amplifier 410, an AND gate 420, an encoder 430, a D-type flip-flop 440, an inverter 470, an out-of-phase detection circuit 450 and a PLL 460.

The PLL 460 generates a write clock of the required frequency on the basis of a reference clock signal 5000. According to the present embodiment, the reference clock signal 5000 is assumed to have a fixed value for facilitating the explanation of the apparatus, and the frequency is changed by the PLL 460 to generate a clock corresponding to the write transfer speed.

The encoder 430 uses this write clock 5020 to encode the write signal 5010 applied thereto from the disk controller 190, thus generating an encoded signal 5030.

As long as the write clock 5020 is in phase with the reference clock signal 5000, the encoded signal 5030 passes directly through the AND gate and is applied to the read-write amplifier 410 so that the signal is recorded on the magnetic medium. Once the write clock 5020 goes out of phase with the reference clock signal 5000, however, the out-of-phase detection circuit 450 detects the phase shift and produces an out-of-phase signal 5040. The disk controller is thus informed, while the output of the AND gate 420 is immediately fixed to "L" by use of the inverter 470 and the D-type flip-flop 440.

Subsequently, the disk controller 190, after confirming that the out-of-phase signal 504 has ceased to be produced, clears the flip-flop 440 and restarts the writing operation under the control of a host system.

Figure 38:
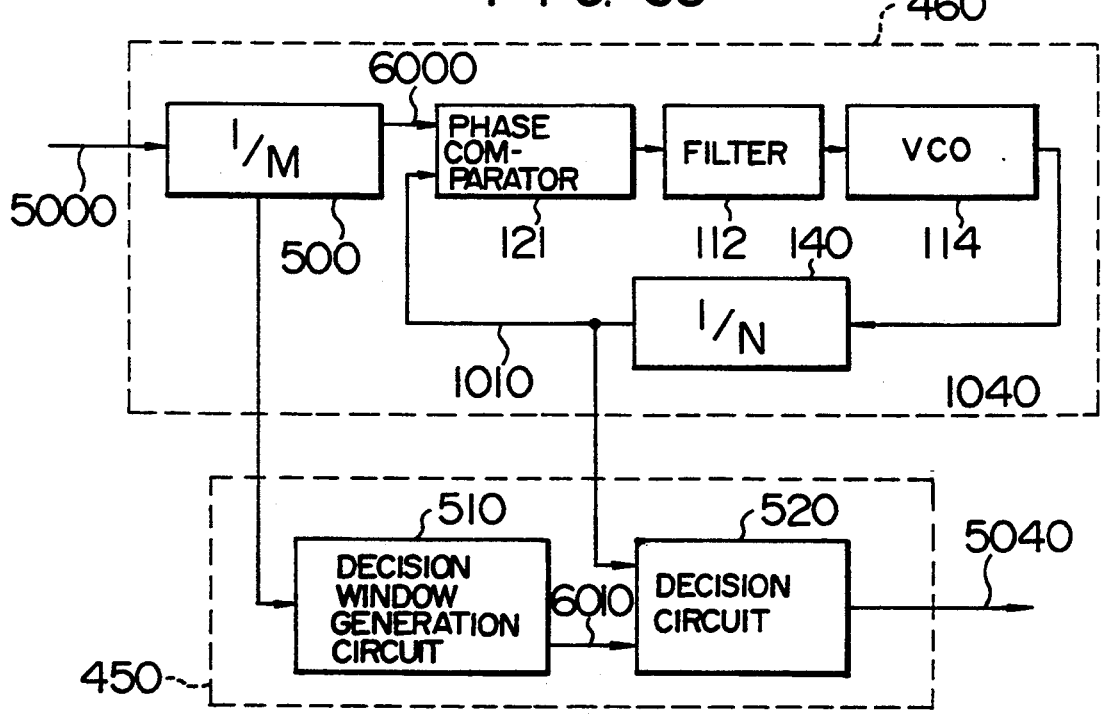
FIG. 38 is a block diagram showing a configuration of an out-of-phase detection circuit.

FIG. 38 is a diagram showing an internal configuration of the write PLL 460 and the out-of-phase detection circuit 450.

The PLL 460 includes an M frequency divider 500 for dividing the frequency of the reference clock signal by M, a VCO 114, an N frequency divider 140 for dividing the frequency of the output clock 1040 of the VCO 114 by N, a phase comparator 121, and a filter 112. In this PLL 460, an output of predetermined frequency is produced by changing the frequency-dividing ratio of the N frequency divider as well as by changing the setting of each part of the VCO, etc.

Also, the out-of-phase detection circuit 450 includes a decision window generation circuit 510 and a decision circuit 520.

The decision window generation circuit 510 receives a signal for dividing the frequency of the reference clock signal 5000 by M from the M frequency divider 500, and generates a window having a certain window before and after the edge compared by the phase comparator 121.

The decision circuit 520 decides whether the edge of the frequency-dividing clock 1010 produced from the N frequency divider 140 is located within the window. An in-phase condition is thus decided if it is located within the window, and an out-of-phase condition otherwise.

Figure 39:
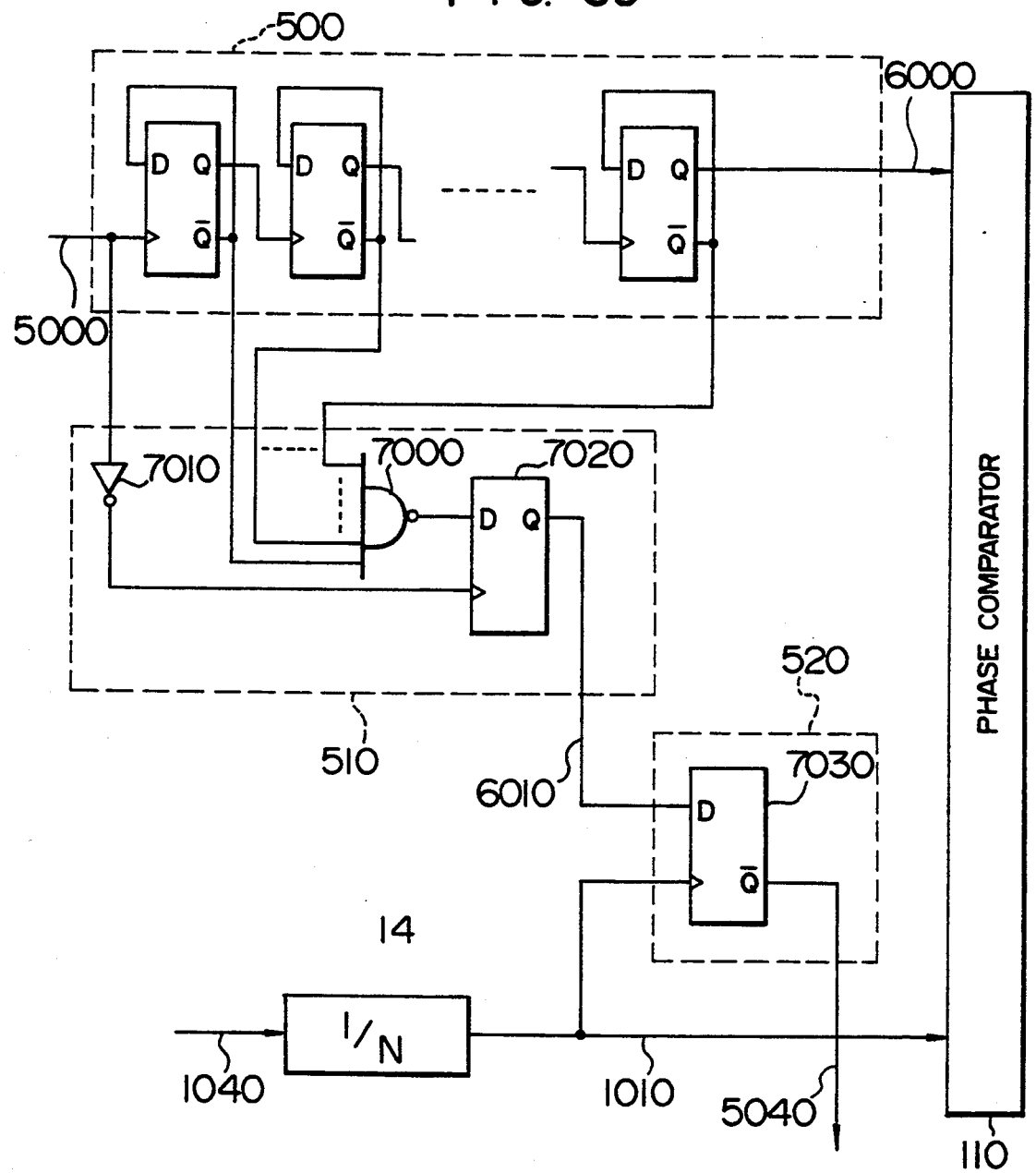
FIG. 39 is a circuit diagram showing the out-of-phase detection circuit in detail.

FIG. 39 shows a specific example having a configuration including the M frequency divider 500, the decision window generation circuit 510 and the decision circuit 520.

The operation of this embodiment will be explained with reference to a case in which the reference clock signal is divided in frequency by a factor of $2^k$.

The division by $2^k$ requires a number k of double-division circuits using D-type flip-flops connected in the system. This corresponds to the M frequency divider 500. The decision window generation circuit 510 includes a k-input NAND 7000, an inverter 7010 and a flip-flop 7020.

The decision circuit is comprised of a flip-flop 7030.

Figure 40:
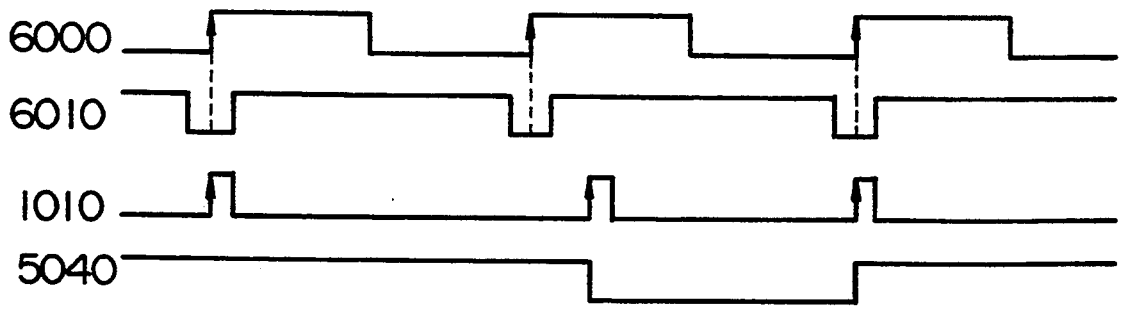
FIG. 40 is a time chart representing the operation of the out-of-phase detection circuit.

FIG. 40 shows a timing chart for explaining the operation of this circuit.

The decision window generation circuit 510 generates a window signal 6010 having a time width corresponding to a half period of the reference clock signal 5000 before and after the leading edge of the M frequency division signal 6000 produced as an output from the M frequency divider 500. If the number of signals applied to the k-input NAND 700 is reduced, the width of the window is of course widened to relax the criterion for synchronism. This window signal 6010 is connected to the D-input of the flip-flop 7030 of the decision circuit 520, and the frequency-division clock 1010 is produced as an output from the N frequency divider 140 to the clock input of the flip-flip 7030.

As shown in the timing chart, if the frequency division clock 1010 has the leading edge thereof located in the window, the out-of-phase signal 5040 is produced in "H" state, and outside of the window, in "L" state.

As described above, according to a magnetic disk apparatus having the magnetic disk system circuit, the phase relations between the timing clock and the data read from the magnetic medium is capable of being set in optimal fashion, and therefore the decoding of high reliability is made possible.

Also, since the write operation is capable of being immediately inhibited after the write clock goes out of phase at the time of writing a data in a magnetic medium, the data on the medium is prevented from being destroyed.

The PLL described above is also applicable to other memory means such as an optical disk memory unit or a magneto-optic disk storage apparatus used with other types of storage media.

Further, the PLL described with reference to various embodiments above is equally realized effectively with an information processing system having a variable data speed.

It will be thus understood from the foregoing description that according to the third feature of the present invention, a phase sync circuit is provided which has the characteristics thereof optimally switchable in accordance with the data transfer speed and which is capable of operating in stable manner against various transfer speeds.

We claim:

1. A phase sync circuit comprising:
    a phase-locked loop circuit including a plurality of circuit elements having respective controllable response characteristics;
    means for generating instructions for controlling the response characteristics of the circuit elements and outputting the instructions to a computer bus; and
    means for receiving the instructions from the computer bus, storing the instructions, and outputting the instructions to the circuit elements to control the response characteristics of the circuit elements in accordance with the instructions;
    wherein the phase-locked loop circuit includes:
    a phase comparator for receiving a pulse signal and a clock signal and comparing the pulse signal to the clock signal, the pulse signal being one of a data signal reproduced from a data recording medium and a reference clock signal;
    a charge pump connected to an output of the phase comparator and having a controllable gain;
    a filter connected to an output of the charge pump and having a controllable filter characteristic; and
    a voltage-controlled oscillator connected to an output of the filter for generating a clock signal and outputting the clock signal to the phase comparator, the voltage-controlled oscillator having a controllable gain and a controllable center frequency; and
    wherein the instructions generated by the generating means include an instruction for controlling the gain of the charge pump, an instruction for controlling the filter characteristic of the filter, an instruction for controlling the gain of the voltage-controlled oscillator, and an instruction for controlling the center frequency of the voltage-controlled oscillator.

2. A phase sync circuit according to claim 1, wherein the phase sync circuit is a single-chip large-scale integration (LSI) phase sync circuit;
    wherein the phase-locked loop circuit is an LSI phase-locked loop circuit formed on a single chip;
    wherein the means for generating instructions for controlling the response characteristics of the circuit elements and outputting the instructions to a computer bus is LSI means formed on the single chip;
    wherein the means for receiving the instructions from the computer bus, storing the instructions, and outputting the instructions to the circuit elements to control the response characteristics of the circuit elements in accordance with the instructions is LSI means formed on the single chip;
    wherein the phase comparator is an LSI phase comparator formed on the single chip;
    wherein the charge pump is an LSI charge pump formed on the single chip;
    wherein the filter is an LSI filter formed on the single chip; and
    wherein the voltage-controlled oscillator is an LSI voltage-controlled oscillator formed on the single chip.

* * * * *